(12) United States Patent
Muehlschlegel et al.

(10) Patent No.: US 11,284,488 B2
(45) Date of Patent: Mar. 22, 2022

(54) CIRCUIT ASSEMBLY AND METHOD FOR OPERATING AN LED MODULE

(71) Applicant: Osram GmbH, Munich (DE)

(72) Inventors: Joachim Muehlschlegel, Groebenzell (DE); Alessio Griffoni, Fossò (IT); Francesco Angelin, Mogliano Veneto (IT); Antonio Stocco, Piombino Dese (IT)

(73) Assignee: ABL IP HOLDING LLC, Atlanta, GA (US)

( * ) Notice: Subject to any disclaimer, the term of this patent is extended or adjusted under 35 U.S.C. 154(b) by 0 days.

(21) Appl. No.: 17/272,936

(22) PCT Filed: Sep. 4, 2019

(86) PCT No.: PCT/EP2019/073569
§ 371 (c)(1),
(2) Date: Mar. 3, 2021

(87) PCT Pub. No.: WO2020/049039
PCT Pub. Date: Mar. 12, 2020

(65) Prior Publication Data
US 2021/0204376 A1 Jul. 1, 2021

(30) Foreign Application Priority Data

Sep. 4, 2018 (EP) .................................. 18192601
Sep. 4, 2018 (EP) .................................. 18192606

(51) Int. Cl.
*H05B 45/10* (2020.01)
*H05B 45/32* (2020.01)
(Continued)

(52) U.S. Cl.
CPC .......... *H05B 45/325* (2020.01); *H05B 45/10* (2020.01); *H05B 45/345* (2020.01); *H05B 45/375* (2020.01)

(58) Field of Classification Search
CPC ...... H05B 45/10; H05B 45/32; H05B 45/325; H05B 45/345; H05B 45/375; H05B 47/00
See application file for complete search history.

(56) References Cited

U.S. PATENT DOCUMENTS 8,860,319 B2 * 10/2014 Naruo .................... H05B 45/14
315/186
2005/0093792 A1 5/2005 Yamamoto et al.
(Continued)

OTHER PUBLICATIONS

International Search Report issued for the PCT Patent Application No. PCT/EP2019/073569, dated Jan. 31, 2020, 5 pages (for informational purposes only).

*Primary Examiner* — Jimmy T Vu
(74) *Attorney, Agent, or Firm* — Kilpatrick Townsend & Stockton LLP

(57) ABSTRACT

An assembly and a method is provided where the LED module includes a plurality of module units interconnected between common connection lines in a sequential order with increasing distances towards a connection terminal of the LED module. The circuit assembly includes an output terminal having a first output terminal portion and a second output terminal portion, a main power supply for supplying an operation voltage potential to a first output terminal portion, a control device for generating a pulse width modulation signal, and an electronic switch coupled to the control device and configured to obtain the pulse width modulation signal and arranged to connect and disconnect a second output terminal portion to/from a reference potential in accordance with the pulse width modulation signal, such as to supply a pulse width modulated voltage to the output terminal. A pulse shaping unit is coupled to the control device.

20 Claims, 13 Drawing Sheets

(51) Int. Cl.
*H05B 45/325* (2020.01)
*H05B 45/345* (2020.01)
*H05B 45/375* (2020.01)

(56) References Cited

U.S. PATENT DOCUMENTS

2010/0091807 A1     4/2010  Deppe et al.
2011/0210678 A1*    9/2011  Grajcar .................. H05B 45/31
                                                           315/192

* cited by examiner

CIRCUIT ASSEMBLY AND METHOD FOR OPERATING AN LED MODULE

CROSS-REFERENCE TO RELATED APPLICATIONS

The present application is a national stage entry according to 35 U.S.C. § 371 of PCT Application No. PCT/EP2019/073569 filed on Sep. 4, 2019; which claims priority to European Patent Application Serial Nos. 18192601.5 filed on Sep. 4, 2018 and 18192606.4 filed on Sep. 4, 2018; all of which are incorporated herein by reference in their entirety and for all purposes.

TECHNICAL FIELD

The present disclosure relates to a circuit assembly for operating an LED module comprising a plurality of module units (smallest electrical units, SEU) which are each interconnected between common connection lines in a sequential order with increasing distances towards a connection terminal of the LED module.

BACKGROUND

The above referenced LED modules may be provided for example as flexible LED strips or rigid LED bars. Corresponding LED modules may acquire lengths of, e.g., 0.5 to 20 m, wherein they are constituted by sequential chains of module units. Each module unit, also denoted as "smallest electrical unit" (SEU), which forms a functional unit, that operates independently once an appropriate voltage is applied, is composed of an LED string, which includes one or more LEDs electrically coupled in series and/or parallel connection, and a current regulator, which compensates for a difference between the operating voltage of the module and a forward voltage of the LEDs and other optional electrical components, for example diodes or resistors, within the string, limits the current through the LED string and converts the same at the given voltage difference into dissipation power. The module units are interconnected between generally two connection lines (anode or "plus" and cathode or "minus" lines) in parallel to each other, which provide the voltage (operating voltage potential and reference voltage potential). The connection lines extend through the LED-strip, so that the module units are sequentially coupled between the connection lines one after the other starting from a terminal of the LED module with increasing spatial distance from the terminal and thereby consume for example sections of the strip having lengths of 4 to 30 cm. On such an LED module of, e.g., 10 m length there may thus be sequentially arranged up to 200 module units.

LED modules such as those described above may be supplied with substantially constant voltage, e.g. 24 V DC voltage, which is generally provided by an electronic control gear (ECG) including for example a converter, or LED driver, respectively. A dimming function generally desirable in case of LED modules is thereby often realized via pulse width modulation. The current and the power for the LED module is transmitted periodically, but within each period only for predetermined duration in a pulse like manner, via the connection lines towards the module units having the LED strings, or the SEU's, respectively. The dimming value corresponds to a duty-cycle ratio, which denotes a time portion of the period within which a constant voltage, or DC voltage, is supplied to the LED module (i.e., the "ON"-time portion).

While the converter (e.g., a buck converter) or LED driver supplying the constant voltage is switched typically in a range of several hundred kHz, for example 200 kHz, the pulse width modulation used for dimming the light generated by the LEDs had previously been at frequencies in the range of only 200 to 500 Hz, which is just sufficient not to be realized by the human eyes.

However, particularly in the case of the above described LED modules having sequentially chained module units, a problem arises in that those module units being most remote from terminal point of LED module, i.e., the SEUs being arranged at the distal end of the chain, may suffer from a darkening effect with respect to the emitted LED light which can be recognized. Such effect increases with the length of the LED module or the distance of connection lines to the corresponding module units, respectively, and may lead to visible problems, for example optical end-to-end emitted light differences, in the case of long connection cables and/or long LED modules.

It may further be noted that a relative darkening of the last module units in the sequence particularly occurs at low dimming values. Detailed analysis by the inventors revealed that different effects cause and contribute to the darkening. Firstly, it is to be considered that with increasing length of the connection lines also the static resistance may play an important role. Secondly, capacitive and inductive effects due to the involved electrical components arranged along the connection lines may exert an influence on the transmitted pulse signal. And thirdly, even non-linear effects due to current regulator which acts to preserve a constant current may play a role. The pulse signal is thus subjected to an attenuation, but in particular also to a distortion. At a duration of the pulse signal of, e.g., 50 µs to 500 µs associated with a dim value or duty-cycle of 10% to 100% at a PWM frequency of for example 2000 Hz, an LED system with connection lines of 30 m and module length of 10 m is, however, not yet comparable to a spatial length of the correspondingly advancing signal pulse expressed in meters.

Rather, it is the rising and falling edges of the pulses, which acquire a higher frequency range when viewed spectrally. An edge of a generated pulse to be transmitted to the LED module has a rising or falling time of for example 1 µs or less. The distortion of the signal herein originates from a disperse behaviour of the spectral components. The signal is convolved in time, each pulse is thus expanded and becomes flatter particular at its edges. It is understood that such effect appears to be more pronounced at shorter pulse widths, i.e., lower duty-cycles or dim values.

A clear aggravation of the problem is to be expected which originates from the various temporal light artifacts metrics defined so far as prescriptions for the future: for example, the SVM-metric (IEC TR 63158: Stroboscopic Visibility Measure) assesses a pulse width modulation up to 2 kHz can be insufficient. PWM dimmed lighting systems will thus operate in the future at higher PWM frequencies. This trend is supported by the demands of manufacturers as well as users of digital cameras, wherein decreasingly shorter exposure times become possible even under lighting conditions using LEDs.

SUMMARY

It is thus an object to improve corresponding circuit assemblies and corresponding methods for operating an LED module such that a light attenuation and temporal light artifacts of individual module units (SEUs) are avoided or at least reduced, and that particularly future requirements regarding the dimming via pulse width modulation is accounted for.

According to one aspect, the object is solved by a circuit assembly comprising the features of claim 1, as well as by a corresponding method according to claim 16. Advantageous aspects and embodiments of the circuit assembly and the method are provided in the appended claims.

According to another aspect, the object is solved by a circuit assembly comprising the features of claim 1. Advantageous aspects and embodiments of the circuit assembly are provided in the appended claims.

First aspects are based on a circuit assembly for operating an LED module comprising a plurality of module units (SEU's, smallest electrical units) which are each connected in parallel between common connection lines in a sequential order with increasing distances towards a connection terminal of the LED module. As described above, that kind of LED modules is subject to the mentioned problems. However, the circuit assembly is not limited to such LED modules. Rather, the circuit assembly proposed herein may also be advantageously applied to other LED modules, which include comparatively long supply and connection lines.

The circuit assembly comprises an input terminal for connecting to a power supply, an electronic control gear (ECG) including an electronic switch and a control device, which comprises an interface for connecting to a dimming device to obtain a dimming value thereof, the electronic control gear being connected with the input terminal and configured to supply a voltage at its output, and an output terminal for connecting with the connection terminal of the LED module either directly or via a cable. The cable functions as an extended connection line.

The electronic control gear (ECG) may include a converter, e.g., a buck converter, functioning as an LED driver. The voltage supplied by the ECG corresponds during operation of the LED module without dimming (duty-cycle ratio of 100%) to a nominal voltage $U_N$, e.g. 24 Volt, with which the LED module is then to be supplied continuously.

For the purpose of dimming via pulse width modulation (PWM) the circuit assembly is further provided with the electronic switch (e.g. an arrangement of one or more MOSFETs or bipolar transistors) and the control device coupled therewith. The electronic switch is configured to control the supplied voltage via opening and closing actions, i.e., to interrupt or forward the voltage supplied by, e.g., the converter. Further, the control device is configured to operate the electronic switch via pulse width modulation with a duty-cycle D dependent from the dimming value at a predetermined period T, such that the LED module connected to the output terminal is supplied with pulses of the nominal voltage, which have a pulse width depending from the duty-cycle D and the period T. The predetermined period T is not limited to specific ranges of time. The period may—as described—correspond for example to a PWM frequency of 200 Hz to 500 Hz, the circuit assembly is, however, particularly suited for higher PWM frequencies up to and even beyond 2 kHz.

Such a circuit assembly may according to embodiments further be provided with the arrangement and capability, that the electronic control gear is controlled to increase a value of the voltage supplied at the output terminal for a duration of a time slice of a predetermined width starting with a rising edge of a respective pulse with respect to a nominal voltage $U_N$ with which the LED module is to be operated in a case without dimming, i.e., duty-cycle 100%.

As a consequence thereof, a mean value taken of the instantaneous values of the voltage signal output over/during an ON-time of a pulse (i.e., the voltage signal averaged over time within an ON-time of each pulse) having a short pulse width (small duty-cycle) may be larger than a corresponding mean value of pulses having a comparatively larger pulse width (larger duty-cycle), and in particular larger than a mean value arising in a case where there is no dimming, i.e., duty-cycle 100% (operation with the continuously constant nominal voltage).

The voltage increase is applied such as to counteract a voltage or current drop in case of short pulse widths between the connection lines at a position of those module units in the sequential order which have the largest distance towards the connection terminal.

Therein, it is a basic idea, in deviation from conventional technologies of dimming via PWM, in which an LED module is supplied with pulses of exactly the nominal voltage amplitude—throughout the pulses—usually set for the LED module, and with which the LED module would also be operated without dimming (i.e., with a duty-cycle ratio of 100%), to effect at least a short duration increase of the voltage within a respective pulse (ideally each of consecutive pulses) with respect to the nominal voltage. Such increase may be adapted in an amount, that the voltage or current drop on the connection line at the position of the last module units (SEUs) is compensated. A light attenuation or black-out of individual LEDs is thereby avoided.

In fact, also the front-most module units (SEUs) of an LED module within the sequence of units close to the connection terminal will generally be affected by the voltage increase, which in contrast to the last module units (SEUs) can be subjected to almost no or just minor voltage or current drops in the transmitted PWM signal. The voltage increase may, however, hereby be compensated by the current regulators provided in each of the module units (SEUs). Apparently, the dissipation power occurring in those current regulators will also jointly rise, which is—converted into heat—subject to certain limits for reasons of security and reliability of the system comprising the circuit assembly and LED module.

The distortion of the voltage signal of a respective pulse becomes most prominent at the rising and falling edges of the same, wherein—with respect to time—the distortion's portion of the pulse duration (the pulse width) becomes larger, when that pulse width becomes short as compared to the whole period, i.e., towards low dim values. Namely, the voltage pulse flattens down like a dispersion effect, thus causing a reduced current conduction time which actually reduces the emitted light. This is due to the strong non-linearity of the LEDs and the current regulator. Thus, if the voltage increase with respect to the nominal voltage is applied only for, or primarily for, low duty-cycles and short pulse widths, and only marginally, or not all, for comparably larger duty-cycles, then the voltage increase may still be compliant with the requirement of a limited dissipation power, because in this case of shorter pulses in a PWM signal, already the total power (including the effective power output converted into light) is small, and as a consequence also the dissipation power remains comparatively small. Some embodiments provide for a pulse-width-dependent upper limit for the voltage increase. Thereby, it is noted that the voltage increase must basically be still compliant with the (pulsed) safe operating area (SOA) of the current regulation device, rather than power dissipation since the SOA takes into account also (voltage-driven) breakdown failures (e.g. avalanche breakdown).

Therefore, one specific aspect provides for an increase of the voltage throughout the pulses supplied to the output terminal, which is larger for a first short pulse width with respect to a nominal voltage as compared with a voltage output for pulses of a second longer pulse width. Such an advantageous embodiment accounts for the effect recognized by the inventors that the signal dispersion exerts stronger effects for shorter pulse widths than for larger pulse widths, i.e., the distortion is a fixed time which becomes percentagely negligible as the duty-cycle increases. The shortest pulse widths herein experience the largest voltage increases.

In another alternative specific aspect, a fixed predetermined voltage signal shape is provided being applicable to all pulse widths, and which includes a voltage increase with respect to the nominal voltage only for a time slice at the start of the pulse (i.e., at its rising edge), the time slice hereby being shorter than the pulse duration or pulse width. Below a certain threshold for pulse widths, the voltage increase is the same for the respective pulses, wherein the pulse widths differ from each other, such that it is herein only the average or mean value taken of the instantaneous values of the voltage signal supplied to the output terminal within each pulse during an ON-time which increases for shorter pulse widths. However, above the certain threshold, the voltage peak is lowered till it disappears. This is also necessary to join up the 100% duty-cycle level, where for example a continuous nominal voltage shall be supplied to the LED module.

According to an embodiment, the short pulse width corresponds to a duty-cycle of 10% or less, such as a duty-cycle of 5% or less, such as a duty-cycle of 2% or less. The period length serving as a basis therefore may correspond to a pulse frequency of 200 Hz or more, such as a pulse frequency of 500 Hz or more, such as a pulse frequency of 2 kHz or more. However, it is basically neither the duty-cycle or period length nor the pulse frequency, which are decisive for the application of the voltage increase, but rather the absolute pulse width or pulse duration in relation to the module layout and lengths of the connection lines causing the distortion of the pulses and particular of its edges. The above stated values correspond, when being combined, to pulse widths of 500 µs, 250 µs, 200 µs, 100 µs, 50 µs, 25 µs, and 10 µs—each value considered as a maximum value of claimed or claimed range (e.g., " . . . 50 µs, or less").

According to a further embodiment, the value of the voltage supplied at the output terminal and increased with respect to the nominal voltage of the respective LED module is determined depending from a pulse width adjusted by the control device. The width (i.e., time duration) of the first time slice is thereby congruent with the pulse width or pulse duration, i.e., the voltage is substantially increased throughout pulse. This function allows to achieve an optimum voltage compensation for the concrete pulse width corresponding to the voltage or current drop determined beforehand on the connection lines at the end of the LED module.

According to a further embodiment the value of the voltage supplied at the output terminal is increased with respect to the nominal voltage $U_N$ of the LED module with even growing amounts towards shorter pulse widths. The dependency can be realized for example by a previously determined continuous function. Thus, steps in power and in emitted light may be avoided which could be recognized by a user currently dimming the light affecting his comfort.

According to a further embodiment, the value of the voltage supplied at the output terminal is not increased with respect to the nominal voltage $U_N$ for the case of a duty-cycle of 100% which is determined from a correspondingly set dim value. For the case, that, e.g., starting with the continuous light emission (duty-cycle of 100%, no dimming) an adaptation of the supplied voltage is applied, then the adjusted value for the duty-cycle of 100% is taken as the nominal voltage, with respect to which the voltage is increased for shorter pulse widths or lower duty-cycles.

According to a further embodiment a factor, with which the value of the voltage supplied at the output terminal is increased with respect to the nominal voltage $U_N$ of the LED module, amounts to 1, 5 or more, and/or 4 or less, such as 3 or more, and thus lies for example in a range 1, 5 . . . 3 or 1, 5 . . . 4.

According to a further embodiment each LED string of the LED module includes one or more LEDs as well as a current regulator, which is connected in series with the LEDs of the LED string, and which forms together with the LEDs (and optional additional diodes etc.) a functional unit per se, i.e., a smallest electrical unit (SEU), which may function and operate independent from an adjacent one in the series. Therein, the current regulator compensates for a residual voltage during operation within the SEU which is not encompassed by the forward voltage of the LEDs and diodes and optional further components between the connection lines, by means of dissipation power. In this case, the voltage supplied at the output terminal is increased with respect to the nominal voltage dependent from the pulse width only to such an extent that the dissipation power occurring in the current regulator does not become larger than in the case of a duty-cycle of 100%. As noted above, this particularly concerns the first module units in the series of module units arranged along the connection lines, which are substantially not affected by the voltage or current drop and will thus reveal considerably more dissipation power at a locally increased voltage (with respect to the nominal voltage $U_N$). As also noted, the absolute dissipation power decreases towards lower duty-cycles because also the proportional operation time decreases, so that dissipation power is of less concern here. Nevertheless, the voltage should not be arbitrarily increased in order to protect the electronic components from overvoltage.

According to a further embodiment, the circuit assembly comprises a current measuring device, which measures an output current supplied to the LED module. Thereby, the output current is measured for a given pulse width in each at least two different points in time within that pulse width in a test cycle. The respectively measured values of the output current are compared with each other. The voltage supplied at the output terminal is then increased and/or adjusted with respect to the nominal voltage $U_N$—in case or operation at this pulse width—dependent from the result of the comparison.

This aspect allows an adjustment and/or increase adapted to the concrete situation during operation. It is then particularly not necessary, to provide a dependency function of the voltage increase with respect to a given pulse width. Rather, the output current supplied to al SEUs may be measured in test cycles during operation, wherein the first point in time is advantageously chosen to lie within the first 50 µs of the pulse, for example, such as within the first 20 µs, such as within the first 10 µs, in order to detect the signature of the distorted rising edge of the respective pulse. The second point in time should cover a time range in which the current flow through all SEUs has stabilized within all SEUs within the pulse duration along with the voltage. The second measurement accordingly serves as a reference.

The measurement device may for example be provided in a LED driver (e.g., buck converter) of the ECG and comprise a simple shunt resistor. The voltage increase may thereby also be realized in the LED driver itself. The measurement and/or adjustment does not need to be carried out with each and every consecutive pulse.

This aspect is also particularly advantageous when LED modules are varied, e.g., when module units (SEUs) are added or activated, or vice versa, when units are removed or deactivated, or when during operation, individual units fail or change operation parameters (e.g., temperature, etc.) which cannot easily be stored in the circuit in advance.

According to an alternative aspect, the circuit assembly comprises a current measuring device, which measures an output current supplied to the LED module. Thereby, the output current is measured for a given first pulse width and for a second pulse width different from the first pulse width each within the duration of a pulse in a test cycle. The measured values are then compared with each other. The voltage supplied at the output terminal is then increased and/or adjusted with respect to the nominal voltage $U_N$—in case of an operation at the first or second pulse widths—dependent from the result of the comparison.

According to this approach, test cycles are carried out between longer intervals of the circuit assembly, in which the measured output current of, e.g., actual pulses having a first pulse width is compared with an output current of the assembly of pulses of another differing pulse width. It is also possible that sequences of pulses with each differing pulse widths are scanned through and in each case the output currents are measured.

During operation, it must be ensured that the user of an LED device does not recognize a flickering. As a consequence, the duty-cycle should—according to a specific embodiment—such as maintained during measurement. This means that during operation at a second pulse width changed with respect to a first pulse width, the period length is also adjusted for the respective test cycle.

The measured output currents are compared with each other. If a long pulse width is selected as the "second" pulse width, for example a pulse width associated with a duty-cycle of 50% or 100%, the results for the second pulse width can be considered as a reference because the above described effects or problems are not existing or at least not prominent in this duty-cycle regime. A difference found between the output currents may thus be used for adjusting the voltage supplied at the output terminal. This application method is also adaptive.

In some of the above referenced embodiments, there is provided a "simple" case of a circuit assembly or method for operating an LED module, when an idealized rectangular voltage sequence is provided for each supplied pulse. Advantageously, a pulse supplied to the LED module having a short pulse width then includes a rectangular shape with considerably increased constant voltage over the pulse duration, while a pulse having a comparably long pulse width includes a rectangular shape with an only moderately increased voltage. As noted above, however, a strongest effect can be achieved by considering a value of the output voltage increased at the start or rising edge of the pulse.

According to another embodiment, there is thus provided a fixed, predetermined common voltage sequence with varying voltage within each pulse, and applicable for all possible pulse widths, or for a sub range of pulse widths. This voltage sequence starts with the first time slice (herein time portion of the respective pulse width), in which the voltage supplied at the output terminal is increased with respect to the nominal voltage $U_N$. The voltage sequence is continued in an adjacent second time slice of the same pulse in which the voltage supplied substantially corresponds to the nominal voltage $U_N$.

An advantage arises in that on one hand a unique voltage signal pattern is used for all pulse widths or for a sub group thereof, in which voltage increases are desirable, only. No process is necessary in which a pulse width is determined or provided in advance, and in which the voltage output is increased as a second step. Rather, a selected pulse width inherently sets the voltage needed to compensate for the voltage or current drop at the last SEUs in a sequence of an LED module. Due to the short term voltage increase at the beginning of a pulse in conjunction with a fixed and limited time slice duration, the effect of the voltage increase becomes more apparent the shorter the respective pulse width is. In other words, the shorter the pulse width is according to this aspect, the larger is the time averaged mean value of the increased voltage over pulse width.

Due to the unique voltage sequence it is further possible to integrate an active or passive circuit part in the circuit assembly which is configured to modify the pulse transmitted from the LED driver as described above in always the same manner. It is not necessary to modify the LED driver or buck converter.

On the other hand an increase of the voltage supplied to the module is applied in this embodiment only when it is actually needed, namely at the point in time of the rising edge of the pulse. Due to this reason, the dissipation power occurring over the sum of all module units is reasonably reduced for all duty-cycles despite the voltage increase, or is—as compared with the conventional case—at least kept small.

According to a further embodiment of this aspect, the first time slice amounts to 10% of a period length or less, such as 5% or less, such as 2% or less, such as 1% or less or alternatively even less than 0.5% or less. The first time slice amounts to 0.1% or more of a period length, such as to 0.2% or more, such as to 0.5% or more. All mutual combinations of above lower n upper limits are possible. These values turned out to be particularly meaningful with respect to a compensation of a voltage or current drop on the one hand and avoiding an undesirable increase on the other hand.

According to a further embodiment of this aspect the value of the voltage supplied to the output terminal is increased in at least one point in time during the first time slice by at least 5% or more, such as 10% or more, such as 20% or more, such as 30% or more with respect to a nominal voltage $U_N$ of the LED module. An optional upper limit is 100% or less. These values turn out to be particular advantageous.

According to a further embodiment of this aspect a common fixed voltage sequence is provided with respect to all available pulse widths, or to a sub range of pulse widths, for the value of the voltage supplied at the output terminal which is to be increased with respect to the nominal voltage $U_N$ within the first time slice, wherein the width of the time slice is the same for all pulse widths. As noted, this aspect may for example be efficiently realized in the form of an additional circuit part, which generates a rising edge common to all pulses. Only a length of a pulse is controlled via the PWM switch.

A second time slice may join the first time slice subsequently, wherein the voltage supplied at the output terminal corresponds to the nominal voltage $U_N$. The substantially constant voltage output in the second time slice is cut-off by the falling edge of the pulse in accordance with the individual pulse width. It may be noted that in case of very short pulses (e.g., duty-cycles of 1% or less), the pulse width may be shorter than the first time slice in which case there is no second time slice.

According to further aspects there is provided for a corresponding method for operating an LED module comprising a plurality of module units which are each interconnected between common connection lines in a sequential order with increasing distances towards a connection terminal of the LED module, the method comprising:

Providing a circuit assembly comprising:
an input terminal for connecting to a power supply and an output terminal for connecting with the connection terminal of the LED module directly or via a cable;
an electronic control gear including an electronic switch and a control device, which comprises an interface for connecting with a dimming device to obtain a dimming value thereof, the electronic control gear being connected with the input terminal and configured to supply a voltage at its output;
wherein the electronic switch controls the supplied voltage via opening and closing actions, and wherein the control device operates the electronic switch via pulse width modulation with a duty-cycle D dependent from the dimming value at a predetermined period T, such that the LED module connected to the output terminal is supplied with pulses of the voltage, which have a pulse width depending from the duty-cycle D and the period T;
characterized by
controlling the electronic control gear to increase an instantaneous value of the voltage supplied at the output terminal 34 for a duration of a time slice of a predetermined width starting with a rising edge of a respective pulse with respect to a nominal voltage $U_N$ with which the LED module is to be operated in a case without dimming;
such as to counteract a voltage or current drop in case of short pulse widths between the connection lines at a position of those module units in the sequential order which have the largest distance towards the connection terminal or the output terminal, when the LED module is connected to the circuit assembly.

Accordingly, the mean value taken of the instantaneous values of the voltage output during an ON-time of a pulse having a short pulse width is larger than a corresponding mean value of pulses having a comparatively larger pulse width.

Further aspects are based on a circuit assembly for operating an LED module comprising a plurality of module units (SEU's, shortest electrical units) which are each interconnected in parallel between common connection lines in a sequential order with increasing distances towards a connection terminal of the LED module. As described above, that kind of LED modules is subject to the problems mentioned. However, the circuit assembly is not limited such LED modules. Rather, the circuit assembly proposed herein may also be advantageously applied to other LED modules, which include comparatively long supply and connection lines.

The circuit assembly comprises an output terminal comprising a first output terminal portion and a second output terminal portion. The circuit assembly provides an output voltage supplied between both output terminal portions. The circuit assembly further has a main power supply $V_{main}$ for supplying an operation voltage potential to the first output terminal portion and a control device for generating a pulse width modulation (PWM) signal. An electronic switch is coupled to the control device and configured to obtain the pulse width modulation signal. The electronic switch is arranged to connect and disconnect a second output terminal portion to or from a reference potential in accordance with the pulse width modulation signal, such as to supply a pulse width modulated voltage to the output terminal. The output voltage between the two output terminal portions is therefore itself subjected to PWM. During operation, the connection terminal of the LED module may for example be connected with the output terminal portions of the circuit assembly. The PWM signal is generally adjustable and corresponds to a dim value set by a user using, e.g., an external device. The control device may generate signals having PWM frequencies of 200 Hz to 500 Hz, however, PWM frequencies up to and even beyond 2 kHz in combination with duty-cycles of less than are particularly advantageous herein.

The main power supply $V_{main}$ may for example include an electronic control gear (ECG) embodied, e.g., as a buck converter, etc. The voltage supplied by such an ECG as such is generally constant and corresponds for example to a nominal voltage $U_N$ of 24 Volt, with which the LED module is then to be supplied continuously except for the time of energy release described below.

A pulse shaping unit is provided which serves for shaping the pulses of the output voltage. The pulse shaping unit is coupled to the control device and configured to store an electrical energy, when the electronic switch disconnects the second output terminal portion from the reference potential, and to release the stored electrical energy to the output terminal, when the electronic switch connects the second output terminal portion with the reference potential. The electrical energy is released in order to shape the pulses of the voltage output, i.e., for example to apply an initial voltage increase within each pulse. Electrical energy may for example be stored and released as a charge of a capacitor ($E=½·CU^2$) or as a magnetic field of an inductor ($E=½·LI^2$) etc. The electrical energy is generated by, or better: obtained from, an auxiliary voltage supply $V_{aux}$ detailed in embodiments below. The pulse shaping unit is a circuit part generally comprising an auxiliary voltage supply, a charge switch, a storage device, and a connection to a terminal of the electronic switch to release the energy towards the output terminal.

The release of the stored energy to the second output terminal portion providing the reference potential to the LED module when connected has a particular advantage in that the electrical energy is then converted into an increased voltage range, i.e., the reference voltage is dropped below ground potential, while the operation voltage potential provided by, e.g., the ECG is held constant (e.g. 24 V with respect to ground). This yields a particular advantage in that, e.g., an ECG or buck converter design does not need to be changed and an existing product framework may simply be kept. Also, redesigning ECG or buck converters to effect short time voltage increases during pulses as described in detail below would yield devices, which may have response times and voltage variations acting on time scales too long for the use intended herein.

Namely, according to the circuit assembly proposed herein, during the overvoltage time effected by the energy release, the electrical current delivered to the module units or SEUs of an LED module is initially zero. The overvoltage is then used to build an electrical current path that is needed to emit light. Actually, when an electrical current path is established, the aim of the overvoltage is accomplished and an increased voltage is no more needed for a given pulse.

Nevertheless, a propagation delay of a respective pulse is generally present along the connection lines interconnected by the SEUs. This delay causes the last module unit or SEU to be reached by the pulse later than the first module unit or SEU, as noted above. Accordingly, the electrical energy is dimensioned to be released so that the overvoltage must last for at least this delay time, which is nevertheless comparatively short, e.g., only few microseconds, but may else lead to unpredictable emitted light variation or black-out of light. This time is short when compared with the pulse width. Nevertheless, the delay time may become important for very small duty-cycles, say 1-10% or even less. The overvoltage time due to the release of electrical energy thus only represents a time slice of a predetermined width smaller than the pulse width at the beginning or rising edge of a pulse.

In view of the above, the electrical energy needed to be released during this phase may be comparatively low. It may be quite independent from a respective SEU type and electrical current, because the energy is basically spent in charging the parasitic elements along the connection lines and the PCB of the module units, which in turn are similar even for very different LED module power levels.

Hence, a circuit part is provided, i.e., the pulse shaping unit, which simply stores—e.g., during "OFF"-time of a pulse—and releases—e.g., during "ON"-time of a pulse—a suitable amount of electrical energy. In one embodiment, an auxiliary voltage of, e.g., −12 V is supplied to charge a capacitor as an example of an energy storage device, and when released to the output terminal, this yields an overvoltage of +24 V−(−12 V)=36 V. The electrical energy, or herein: charge, is injected into the connection lines, and a voltage envelope of the pulse naturally declines to the 24 V nominal voltage $U_N$, once the electrical energy is consumed by the parasitic elements, etc.

The voltage increase due to the released energy is applied such as to counteract a voltage or current drop in case of short pulse widths between the connection lines at a position of those module units in the sequential order which have the largest distance towards the connection terminal.

It may be noted that the pulse width unit is also coupled to the control device, which allows controlling the storage and release actions in a coordinated manner with the PWM signal and thus with the "ON" and "OFF" times of the electronic switch (the main PWM switch). As a consequence, this allows to release the electrical energy precisely when it is needed, namely at the beginning or rising edge of a pulse.

The first time slice of voltage increase within a pulse may be the same for all pulse widths, and may amount to 10% of a period length or less, such as 5% or less, such as 2% or less, such as 1% or less or alternatively even less than 0.5% or less. The first time slice amounts to 0.1% or more of a period length, such as to 0.2% or more, such as to 0.5% or more. All mutual combinations of above lower and upper limits are possible. These values turned out to be particularly meaningful with respect to a compensation of a voltage or current drop on the one hand and avoiding an undesirable increase on the other hand.

It is noted that in the event that the duty-cycle is large, the "OFF"-times may become short and the charge time of a capacitor or a generation time of a magnetic field may become too small such that less energy is stored (and later released). In this regard, there may possibly arise a pulse width dependency of storage of electrical energy. However, as noted above, in such event of large duty-cycles, the effect of unpredictable emitted light variation becomes low such that the overvoltage is actually hardly needed herein, so that this effect may even be advantageous.

The circuit assembly is advantageously used with in case of duty-cycles of 10% or less, such as a duty-cycle of 5% or less, such as a duty-cycle of 2% or less, such as 1% or less. Considering the PWM frequencies noted above, these values lead, when being combined, to pulse widths of 500 µs, 250 µs, 200 µs, 100 µs, 50 µs, 25 µs, 10 µs, and 5 µs—each value considered as a maximum value of a range (e.g., " . . . 10 µs, or less").

According to an embodiment the pulse shaping unit represents a charge pump comprising a capacitor $C_{store}$. A charge pump is particularly useful for storing electrical energy and can be properly dimensioned to define the amount of electrical energy needed and the time duration needed for energy release.

According to a further embodiment, the pulse shaping unit further comprises an auxiliary voltage supply $V_{aux}$ different from the main power supply $V_{main}$, wherein the auxiliary voltage supply $V_{aux}$ supplies a predetermined voltage potential which is negative with respect to a ground potential. The pulse shaping unit of this embodiment further includes a charge switch coupled to the control device and configured to obtain the pulse width modulation signal and arranged to connect and disconnect the auxiliary voltage supply $V_{aux}$ with or from one (first) terminal of the capacitor $C_{store}$ in accordance with the pulse width modulation signal. Thereby the other (second) terminal of the capacitor $C_{store}$ is connected with the ground potential. This structure of a pulse shaping unit provides for a particularly simple but well-defined voltage range expansion. Also, as noted, the control of the charge switch via the PWM signal allows to precisely define the energy release with the beginning or rising edge of a pulse.

According to a further embodiment the one (or first) terminal of the capacitor $C_{store}$ is connected with a terminal of the electronic switch to allow releasing the electrical energy to the output terminal, when the electronic switch connects the second output terminal portion with the reference potential, wherein the reference potential is provided by an amount of electrical energy currently stored in the capacitor $C_{store}$ during release. Such connection allows to apply the overvoltage directly to the out terminal.

According to a further embodiment, a current limiting device, for example a resistor $R_{limit}$, is interconnected between the auxiliary voltage supply $V_{aux}$ and the one terminal of the capacitor $C_{store}$, when the charge switch connects auxiliary voltage supply $V_{aux}$ with or from the one (first) terminal of the capacitor $C_{store}$ during operation. The resistor allows setting a charge time for the electrical energy.

According to a further embodiment, the pulse shaping unit further comprises an inverter interconnected between the control device and the charge switch, which inverts the pulse width signal obtained from control device and input to the charge switch to control switching, such that when the electronic switch connects the second output terminal portion to the reference potential, the charge switch disconnects the auxiliary voltage supply $V_{aux}$ from one terminal of the capacitor $C_{store}$, and vice versa, in accordance with the pulse width modulation signal. This feature serves to coordinate the charging of the capacitor and the energy release via the electronic switch in a suitable manner.

According to a further embodiment, a device configured to connect the terminal of the electronic switch with the ground potential when the electric energy stored in the capacitor has been released and a value of the reference potential has substantially approached the ground potential, while disconnecting the terminal of the electronic switch from the ground potential during release. Such a device guarantees return to the usual operation at nominal voltage after the electrical energy injected into the LED module is consumed and the capacitor is going to be charged with opposite polarity. Instead, the conventional electrical current path from $V_{main}$ to ground is preserved, then, while, when the capacitor is charge, current flow from the capacitor directly to ground is prevented.

According to one basic aspect of that embodiment, the device is a diode Dby-p, wherein an anode-side terminal of the diode Dby-p is connected with the terminal of the electronic switch and a cathode-side terminal is connected with ground potential. This aspect provides for a simple, reliable and cheap structure.

According to an alternative aspect of that embodiment, the device is an active diode switching circuit, which comprises: an auxiliary controlled switch, an auxiliary switch controller and a comparator.

The auxiliary controlled switch is connected between the terminal of the electronic switch and the ground potential in parallel to the capacitor $C_{store}$, in order to allow bypassing the capacitor $C_{store}$, when the auxiliary controlled switch is closed. The auxiliary switch controller, such as is a flip-flop, has an out terminal Q coupled to the auxiliary controlled switch such as to open and close the auxiliary controlled switch according to a set state of auxiliary switch controller. The comparator is arranged to compare a voltage between the terminals of the capacitor $C_{store}$ with a threshold value, or to compare a current through a body diode of the auxiliary controlled switch with a threshold value. Given this structure, an output terminal of the comparator is connected with an input terminal S of auxiliary switch controller in order to set the state of the same. Thereby, the auxiliary switch controller includes a further input terminal R connected to an input control terminal of the charge switch in order to control the auxiliary controlled switch in accordance with the pulse width signal. By actively applying a controlled switching in accordance with the energy release state detected by the comparator, a loss of total voltage due to the forward bias of the diode and thus loss of power can be avoided.

According to a further embodiment, the pulse shaping unit further includes an additional electronic switch connected between the capacitor $C_{store}$ and the ground potential and configured to enable storing and releasing electrical energy when the additional electronic switch is closed, and to disable storing and releasing electrical energy when the additional electronic switch is opened. The additional switch thus allows to activate the energy storage and release and the resulting voltage increase only when it is actually needed, e.g. in case of small pulse widths.

According to a further embodiment, the additional electronic switch has an input control terminal connected to the control device, which is configured to control enabling and disabling of electrical energy storage and release, respectively, dependent from a result of a comparison between the currently used duty-cycle D for the pulse width modulation signal and a predetermined threshold value for the duty-cycle. Since the control device is in possession of the duty-cycle data and the PWM generation, such link is particularly efficient in selecting only a limited use of energy storage and release and voltage increase.

According to a specific embodiment of that aspect, the control device is configured to enable electrical energy storage and release, only when the currently used duty-cycle D is below the threshold value. The threshold value may be stored in a memory at the control device, or may be programmed, or determined depending on environmental conditions.

According to a further embodiment, the capacitor $C_{store}$ and an optional current limiting device, for example a resistor $R_{limit}$, are dimensioned such as to allow storing the electrical energy by charging the capacitor $C_{store}$ from the auxiliary voltage supply $V_{aux}$ in a characteristic time scale shorter than a period of the pulse width signal generated by the control device.

According to a further embodiment, the electronic switch is an n-channel MOSFET and/or the charge switch is a PNP bipolar transistor and/or the auxiliary controlled switch is an n-channel MOSFET. In the common anode set-up as proposed herein, the dimmer circuitry is based on an n-type switch, typically an n-channel MOSFET, which may generally be cheaper than a p-type switch and which has a common ground signal driving that eases the circuitry around. This is different from a typical "automotive" system, where a common ground is mandatory, for example being realized by a car chassis. Hence, the overall setup with the pulse shaping unit and the electronic switch positioned on ground potential side in combination with n-channel MOSFETS as switches becomes particularly advantageous.

BRIEF DESCRIPTION OF THE DRAWINGS

The accompanying drawings illustrate non-limiting embodiments and, together with the description, serve to explain them. Further non-limiting embodiments and many of the intended advantages will become apparent directly from the following detailed description. The elements and structures shown in the drawings are not necessarily shown to scale relative to each other.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

DETAILED DESCRIPTION

Figure 1:
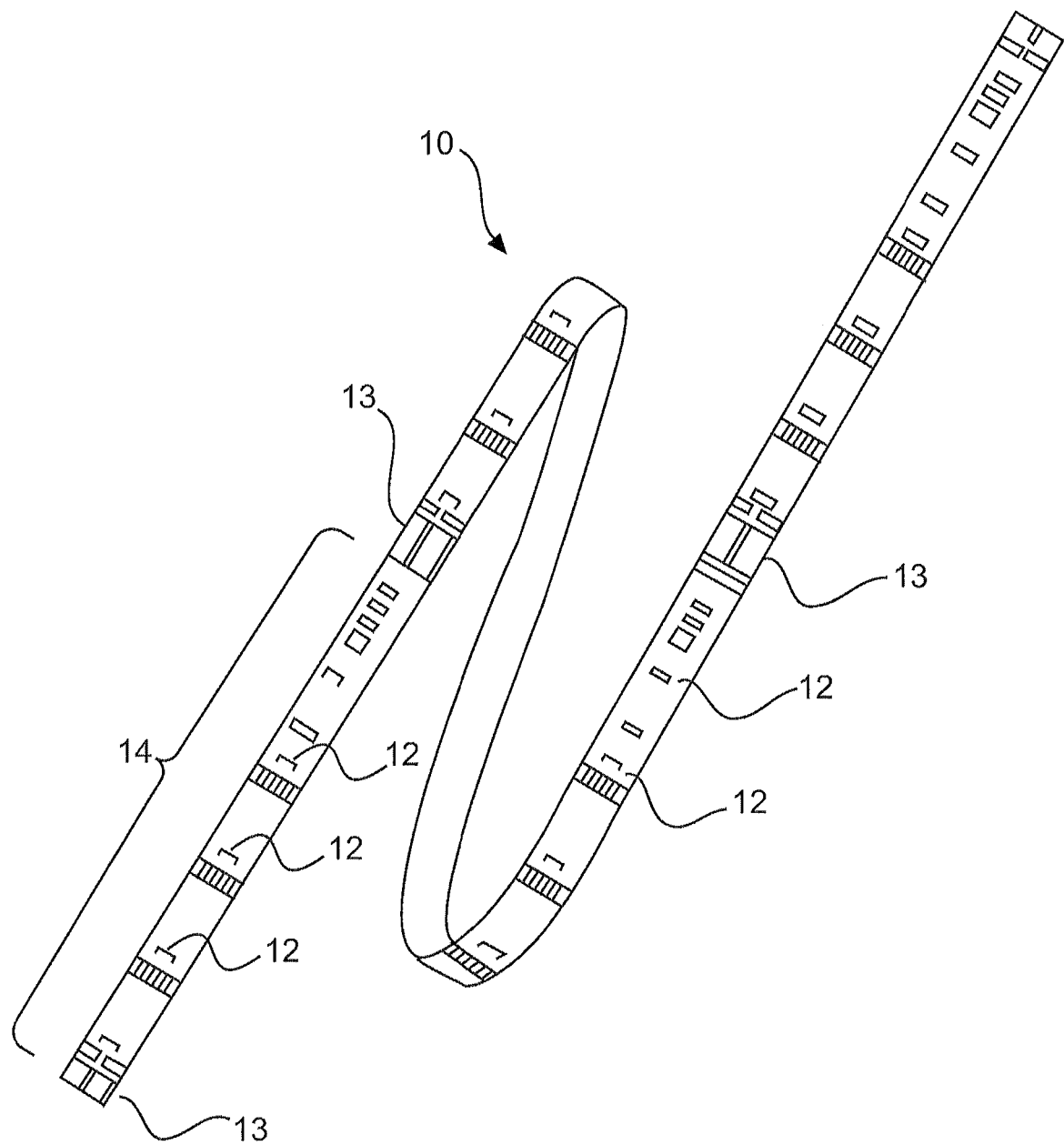
FIG. 1 shows a perspective view of a flexible LED module or strip, respectively.
Figure 2A:
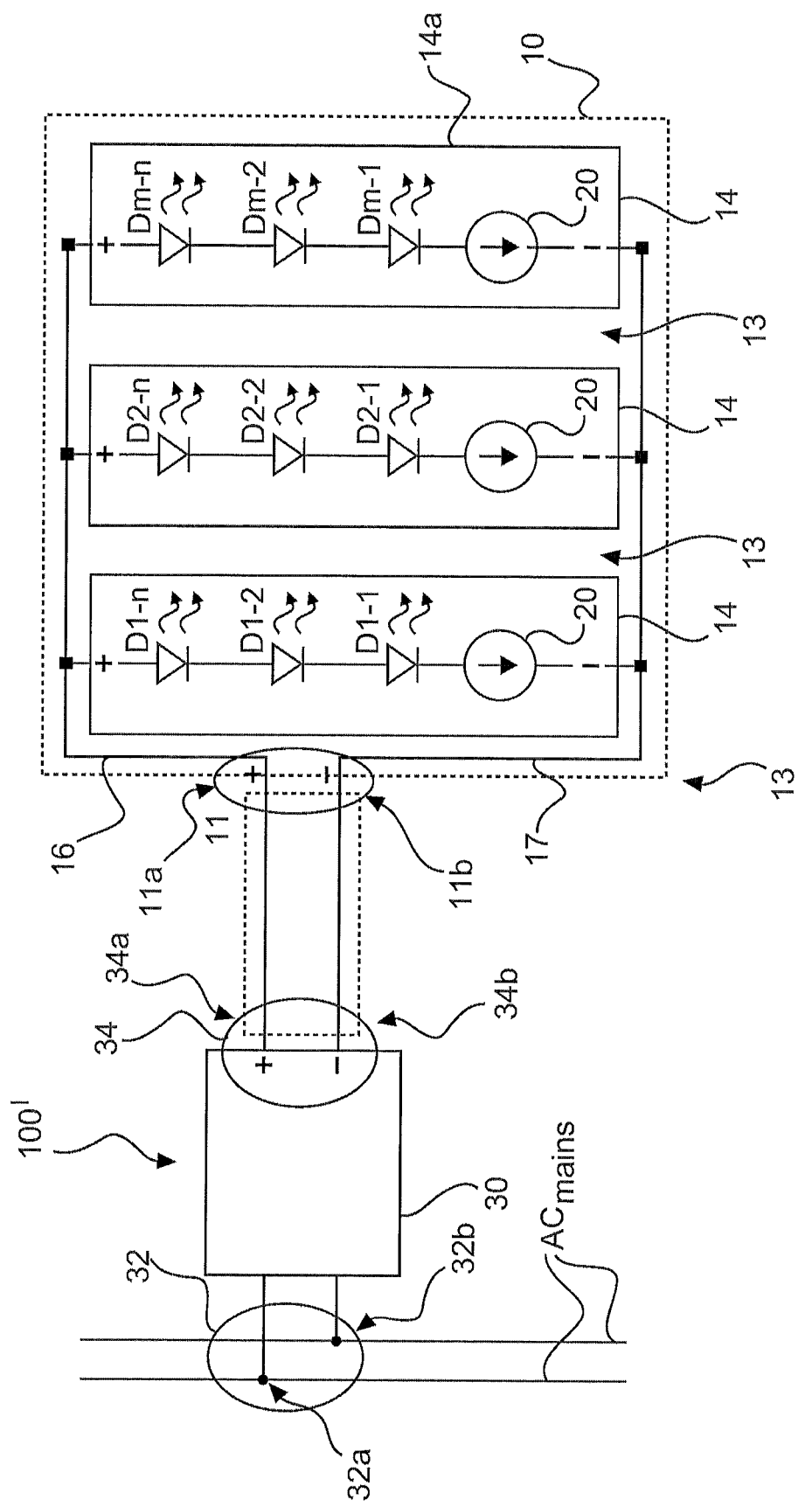
FIG. 2A shows in a block diagram an exemplary LED module having a single common return connection line connected to a circuit assembly.
Figure 2B:
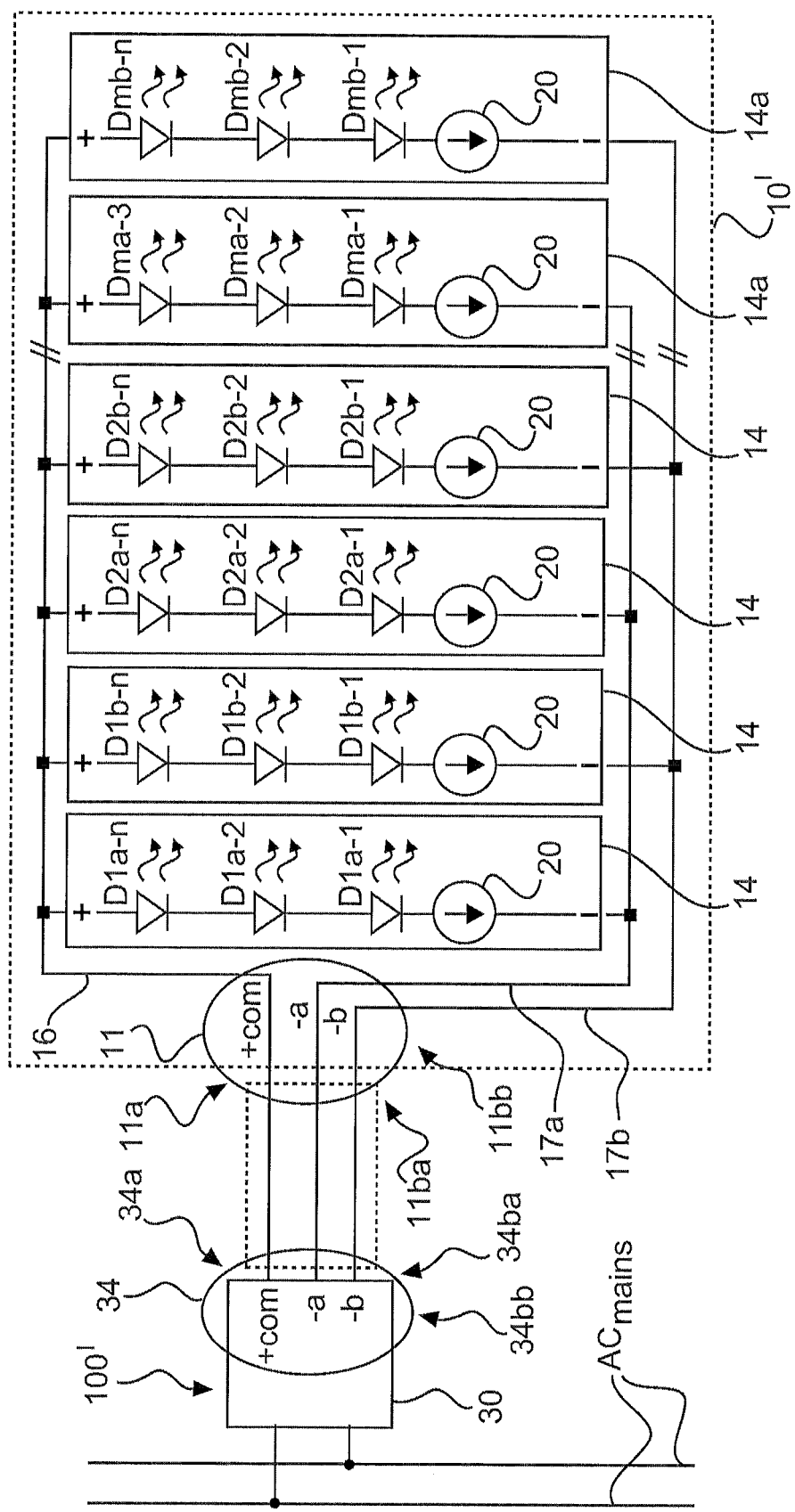
FIG. 2B shows in a block diagram an exemplary LED module having a multiple return connection lines connected to a circuit assembly
Figure 3:
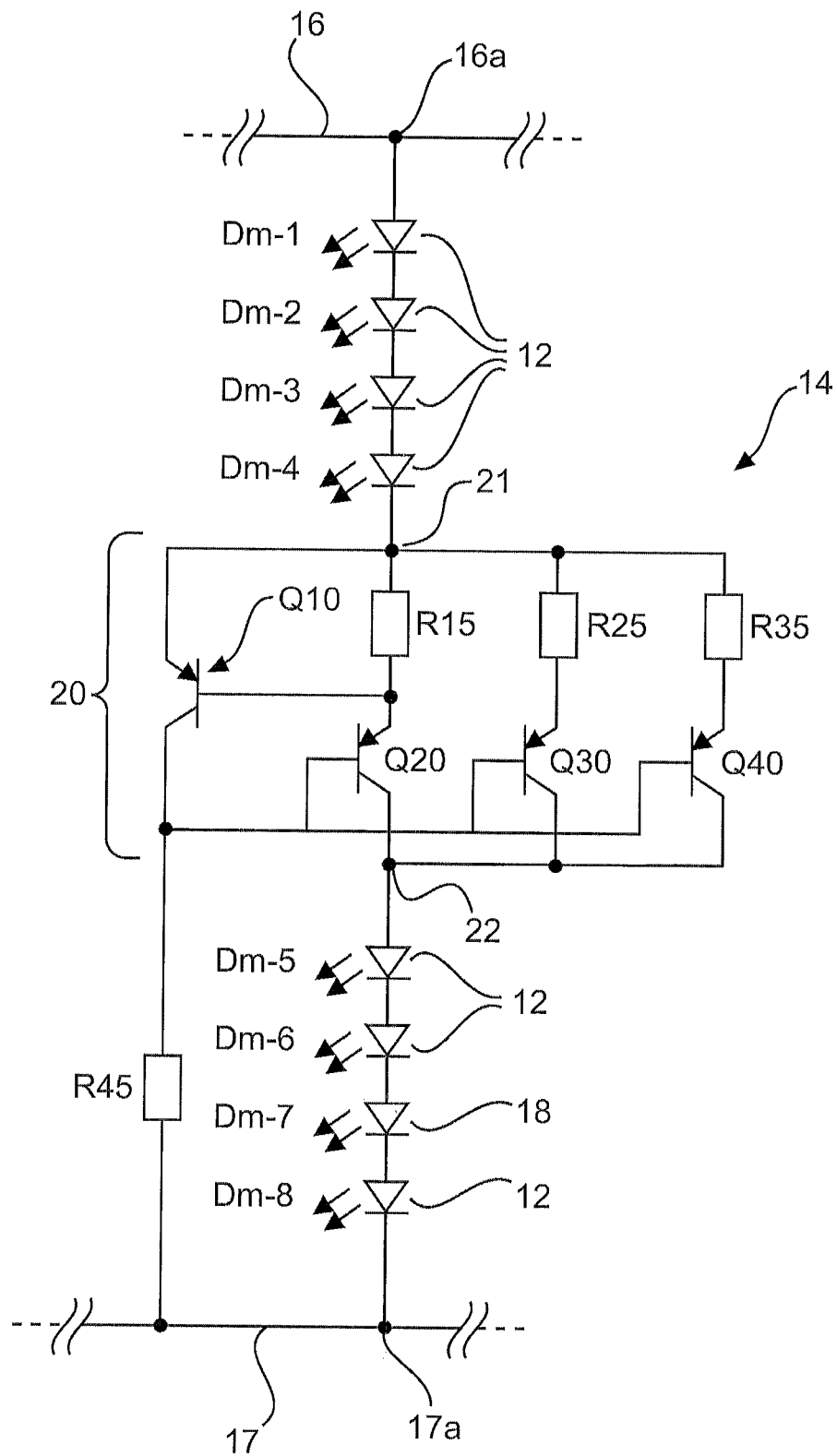
FIG. 3 shows an example circuit diagram of a module unit in FIG. 2.

In FIGS. 1 to 3 an example of a flexible LED module is shown in a schematic illustration, which can be operated and dimmed using a circuit assembly and a corresponding method. In FIG. 1 there is depicted an exemplary perspective view of an LED module 10 formed as an LED strip. Herein, the example relates to an LED module of the product line LINEARlight FLEX ADVANCED, by Osram GmbH, Munich (see also corresponding data sheet dated Apr. 26, 2018). The LED module 10 comprises a number of module units 14, which each form a self-contained functional unit and are denoted in the following also as shortest electrical units (SEUs), and which are each supplied with power via connection lines 16, 17 (see also FIG. 2).

The LED module shown in FIG. 1 has a length of 10.000 mm, wherein each module unit 14 acquires a partial section having a length of 100 mm. The strip-shaped LED module 10 shown in the figures may thus comprise for example 100 shortest electrical units. In each module unit 14 there is provided a plurality of light emitting diodes (LEDs 12) suitably connected in series. The LEDs 12 include a mutual distance of 16.7 mm between adjacent LEDs. One or more of the module units 14 may be separated from the strip at transition portions 13 without affecting the functionality of the other SEUs.

With reference to FIG. 2A a schematic block diagram of an LED module 10 connected to a circuit assembly for operating the LED module is depicted. The module units 14 are each interconnected between the connection lines 16, 17 in parallel to each other. One transition portion 13 functioning as a connection terminal 11 of the LED module 10 comprises a first connection terminal portion 11a for a first connection line 16 as well as a second connection terminal portion 11b for a second return path connection line 17. Therein, the first connection terminal portion 11a is configured to be supplied with a positive voltage potential, and the second connection terminal portion 11b is configured to be supplied with a reference voltage potential. The exemplary LED module 10 is provided with a nominal voltage $U_N$ of 24 Volt.

The circuit assembly 100' substantially comprises an electronic control gear (ECG) 30 that generally provides the nominal voltage $U_N$ but may also increase the voltage as will be explained below, for time slices. The ECG 30 as defined herein includes an output stage that may add further components than just a converter, for example PWM generating devices (dimmers), further interfaces to couple external devices, or pulse shaping units and control switches etc. as explained below. ECG 30 has an output terminal 34 including a first output terminal portion 34a and a second output terminal portion 34b, which are configured for connection with respective connection terminals 11a, 11 b of the LED module 10 for example via a cable including respectively extended connection lines as indicated in FIG. 2A (and also in FIGS. 2B and 10-13). ECG 30 also has an input terminal 32 comprising a first input terminal portion 32a and a second input terminal portion 32b, which serve for connection with a power supply $AC_{mains}$, which may be (as indicated) an AC- but also a DC-power supply.

The circuit assembly of FIG. 2A reveals one "anode side" (for carrying an operation voltage potential) connection line 16 and one cathode side (for carrying a reference voltage potential (0 V), or alternatively a negative base potential as will be described with respect to the 3rd to 6th embodiments below) connection line 17 both lines being interconnected by a number module units 14 which are also denoted as shortest electrical units (SEUs).

Alternatively, as shown in FIG. 2B, an LED module 10' may be arranged in two (or more) groups of module units 14, the combined circuit assembly 100' and LED module 10 thus representing a multiple channel system. Each group has its distinct return connection line 17a or 17b. Such type of system is common in practical set-ups, where multiple color SEUs are used to "tune" the light color. The so-called "tunable white" systems are built with two different channels, one for the "warm" LEDs and one for the "cold" LEDs. Other systems use a three-channel arrangement for achieving true RGB characteristics, or a four-channel stack when a color rendering white is needed (RGB-W). Historically, these systems have been built with a "common anode" connection line 16, which means that all the SEUs or module units 14 have a common "plus" line and multiple independent return connection lines which is indicated in FIG. 2B by connection lines 17a, 17b. In that instance a RGB-W system may have 5 wires in total, the common "plus" connection line 16 and 4 return connection lines 17a, 17b, etc. namely one for each color. The output terminal 34 and the connection terminal 11 are then provided with corresponding output terminal portions 34ba, 34bb and connection terminal portions 11ba and 11bb, respectively, as shown in FIG. 2B, while the common anode side ("com") is similar to that as shown in FIG. 2A.

It is noted that all embodiments explained herein refer to each of one anode connection line 16 and one return connection line 17, but the case of multiple channel systems with 2 or more return connection lines shall in particular be encompassed as well, which pertains also to the scope defined in the appended claims which cover also multiple channel circuit assemblies 100, 100' and the operation of respective LED modules 10. In such cases, the additional circuitry shown herein (pulse shaping units, electronic switches, etc.) applies independently to each separate channel.

In FIGS. 2A and 2B, a last one of the SEUs or module units 14 is denoted with numeral 14a, which will be explained in more detail below.

With reference to FIG. 3, a more detailed circuit diagram of a SEU or module unit 14 is explained. The various module units 14, 14a of the LED module 10 are substantially identical to each other. The module unit 14 shown comprises 7 LEDs 12, namely the LEDs Dm-1, Dm-2, Dm-3, Dm-4, Dm-5, Dm-6 and Dm-8. These LEDs 12 are connected in series together with a diode Dm-7 (numeral 18) and a current regulator 20, which is herein formed as a linear regulator. Number "m" denotes the sequence number of the module unit 14 in the sequence of SEUs in LED module 10.

The current regulator 20 is configured to limit the current through the module unit 14 supplied via the connection line 16 at an input node 16a of the module unit 14 to a predetermined maximum value. For this purpose, an input terminal 21 of the current regulator 20 is connected with an emitter of a PNP bipolar transistor Q20 via resistance sensor R15. A collector of the transistor is in turn connected with an output terminal 22 of the current regulator 20.

At the same time an emitter of a further PNP bipolar transistor Q10 is connected with the input terminal of the current regulator 20, while its collector is connected with the reference potential at connection line 17 via a resistor R45. Further, the base of bipolar transistor Q20 is collected with the further bipolar transistor Q10, and the base of further bipolar transistor Q10 is connected with the emitter of bipolar transistor Q20. In a similar manner further branches consisting of R25 and R35 connected in series with further PNP bipolar transistors Q30 and Q40, respectively, are connected in parallel to the branch consisting of resistor R15 and transistor Q20, wherein like transistor Q20 respective bases of bipolar transistors Q30 and Q40 are connected with the collector of further bipolar transistor Q10.

In operation, a voltage drop on resistor R15 is always kept equal to about one $V_{be}$ (threshold voltage of transistor). For any voltage drop larger than 0.8 V, the current regulator enters the normal operation and sets the nominal current. The current is always regulated as far as there is enough voltage drop, which is guaranteed at the nominal voltage. When normal operation is achieved, the voltage drop at the current regulator is about 2 V. The current regulator shown in FIG. 3 is only a specific example and the structure, function and use of current regulators are well known to those skilled in the art. Also, current regulators may also be embodied as an IC or other discrete configurations and the embodiments described herein shall not be limited to specific kinds of regulators.

Figure 4:
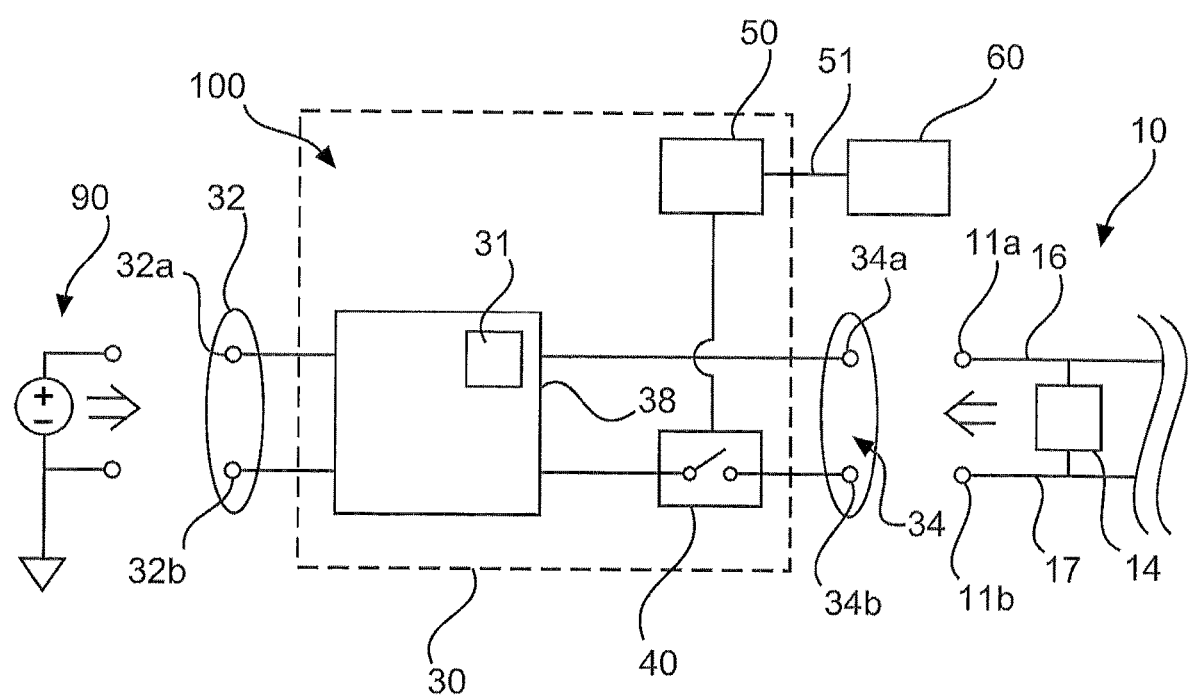
FIG. 4 shows a schematic block diagram of a circuit assembly according to a first embodiment.

In FIG. 4 there is illustrated a circuit assembly 100 for operating and dimming an LED module 10 according to a first embodiment. The circuit assembly 100 comprises an input terminal 32 having a first input terminal portion 32a and a second input terminal portion 32b for providing the circuit assembly with a voltage from a power supply 90. The voltage may originate from components of a switched mode mains power supply such as for example a rectifier and arrangements of noise suppression chokes, etc, (not shown). An electronic control gear 30 (ECG) such as a converter or LED driver is electrically connected with the input terminal 32 and comprises for example a buck converter 38. Optionally, a measurement device 31 to be explained below may be provided in the ECG. LED drivers and converters are well known to the person skilled in the art with regard to function and structure such that a detailed description may be omitted herein referring in this regard to publicly available text books.

On the output side, the electronic control gear 30 is connected to an output terminal 34 consisting of a first output terminal portion 34a and a second output terminal portion 34b. The electronic control gear 30 is configured to regulate the supplied input voltage to a nominal voltage $U_N$ and to output the same at the output terminal 34. Between the buck converter 38 and the output terminal 34 there is arranged an electronic switch 40 on the negative or reference potential side, which for example comprises one or more transistors and is configured to separate or forward the reference potential output from the buck converter 38 from/to the first output terminal portion 34b. The electronic switch 40 serves for dimming the LED module 10 connected to the output terminal 34 of the circuit assembly 100 by frequent and periodic opening and closing operations of the switch via pulse width modulation (PWM).

The opening and closing of the electronic switch 40 is controlled by a control device 50, which is part of the circuit assembly 100. The control device 50 obtains a dim value set by a user at an external dimming device 60 and calculates or determines a duty-cycle D thereof that is necessary to effect the dim value at the LED module. The duty-cycle D represents that portion of a periodic signal which corresponds to an "ON"-time thereof, in which consequently a voltage output by the electronic control gear 30 is forwarded to the output terminal 34 via the electronic switch 40. In case of a duty-cycle of 100%, the LED module 10 connected to the output terminal 34 is not dimmed, i.e., it is operated at maximum power.

In the embodiment shown, the pulse width modulation is effected by the control device 50 at a frequency of 2 kHz, i.e., the period or period length amounts to 500 μs. The pulse width modulation signal supplied to the output terminal is substantially rectangular in this embodiment ("ON" with having a specified voltage output, "OFF" with having 0 Volt, between steep edges with a duration of only about 1 μs at maximum). In comparison thereto, the electronic control gear 30, or more specifically the buck converter 38, is switched at a high frequency of, e.g., 150 kHz and thus delivers a substantially constant voltage, on which there may be identified—if at all—a minor sawtooth-like fluctuation of corresponding frequency. The regulation by the electronic control gear 30 (buck converter 38) by means of a controller (not shown) is set such as to supply a nominal voltage $U_N$ of 24 Volt.

In a more specific modification of this embodiment, the electronic control gear 30 (buck converter 38) and in particular the controller or the component performing the switching in the converter may also be configured such that the voltage supplied at the output terminal may be regulated to even higher values dependent from the output current (i.e., dependent from the average load corresponding to the duty-cycle determined for dimming the LED module 10). For the purpose of measuring the output current, the measurement device 31 like that shown in FIG. 4 may be provided.

Alternatively, a tapping point at a voltage divider generally provided at an output stage of a buck converter is used which feeds back values corresponding to the currently output voltage during the regulation process.

Figure 6:
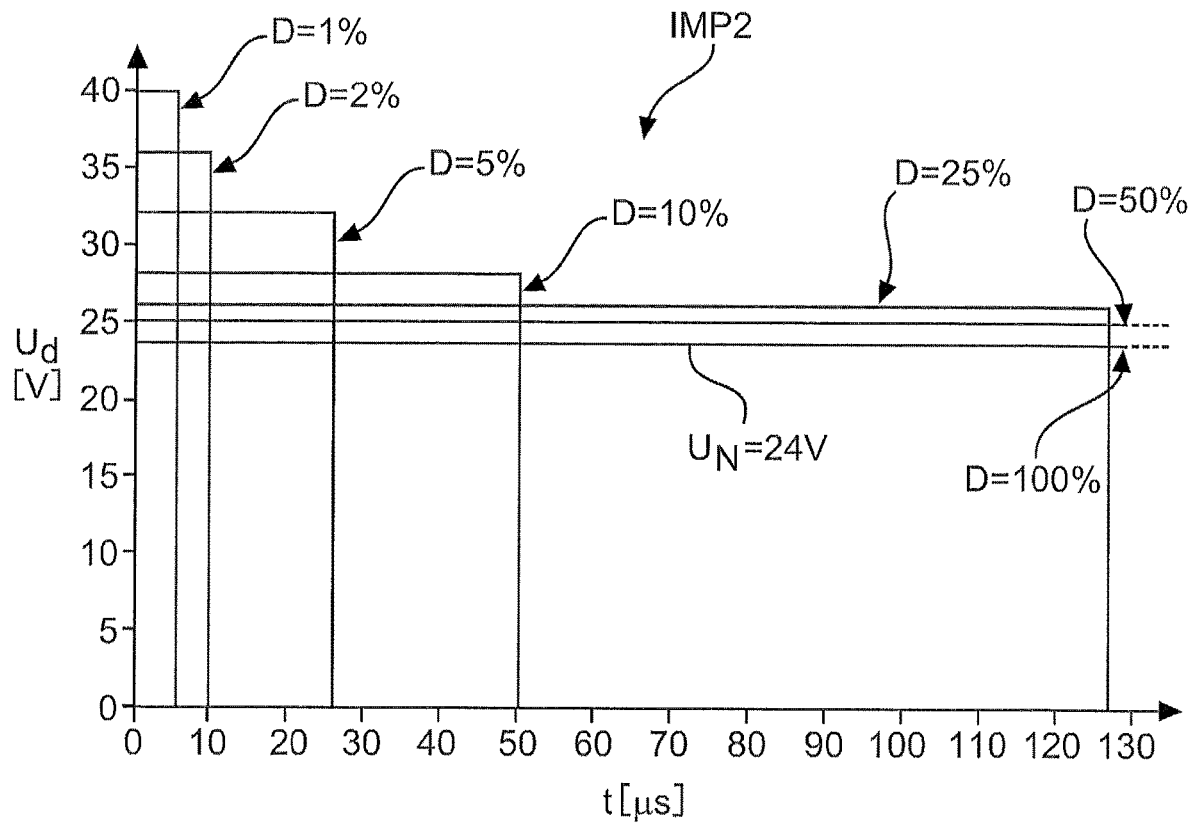
FIG. 6 shows in a diagram a voltage sequence versus time for pulses of differing pulse widths (duty-cycles), which are each generated pursuant to the first embodiment.

FIG. 6 shows in a diagram plots of the instantaneous voltage (during a period) versus time supplied to the output terminal 34 by the ECG 30 via control of the electronic switch 40 by means of pulse width modulation for various duty-cycles (1%, 2%, 5%, 10%, 25%—the values for 50% and 100% are merely indicated). The period ("ON"-time plus "OFF"-time for each period) amounts to 500 μs as noted above.

It has to be noted that the control device 50 may according to other embodiments also be connected with the buck converter 38 directly, in order to achieve an increase of the voltage supplied by the converter in a coordinated manner with the switching action actively and dependent from the duty-cycle.

In the first embodiment, as can be seen from FIG. 6, the voltage supplied by the ECG 30 is increased with respect to the nominal voltage $U_N$ (in the embodiment 24 Volt) the more the shorter the pulse width of the pulse becomes, i.e., the lower the duty-cycle is (at fixed period lengths). For the duration of a pulse, a value of the increased voltage is held substantially constant throughout the pulse (deviations from this feature are, however, allowed in this and other embodiments).

Hence, the first embodiment provides for an increase of the value of the voltage with respect to a nominal voltage ($U_N$) supplied by the ECG 30 to the output terminal 34 for a first time slice of a complete pulse width of each pulse. More specifically, the amount of the increase is applied depending on a corresponding pulse width such that the voltage or current drop between the connection lines 16, 17 which occurs at the position of the last module units (SEUs) 14a in the sequence which reveal the largest spatial distance towards the connection terminal 11 of the LED module 10 is efficiently and recognizably counteracted. "Recognizably" herein means that a darkening, light attenuation or black-out due to the voltage or current drop at the last module units 14a is not or only marginally visible to a user.

According to the present embodiment, the increase of the voltage is controlled in a stepless manner. For this reason, a continuous function is realized in, e.g., a controller (not shown) of the ECG 30, which sets up a relation between the voltage increase and the pulse width. Implemented embodiments (IMP1, IMP2) of such two of functions which turned out to be useful are provided in table 1:

TABLE 1

| Duty-cycle D [%] | $U_{str}$ [V] | $U_{dmax}$ (D) [V] | $U_{dimp1}$ (D) [V] | $U_{dimp2}$ (D) [V] |
|---|---|---|---|---|
| 100 | 22 | 24.0 | 24 | 24 |
| 50 | 22 | 26.0 | 25 | 25 |
| 25 | 22 | 30.0 | 26 | 26 |
| 10 | 22 | 42.0 | 27 | 28 |
| 5 | 22 | 62.0 | 28 | 32 |
| 2 | 22 | 122.0 | 29 | 36 |
| 1 | 22 | 222.0 | 30 | 40 |

Therein $U_{str}$ denotes the forward voltage of the diodes in the LED string (of SEU or module unit 14), which (fixedly) ranges at about 22 Volt (see above: 7 times 3 Volt plus 1 times 1 Volt), $U_{dmax}$ (D) denotes an upper limit for the increased value of the voltage under consideration of the maximum allowed dissipation power for each duty-cycle, $U_{dimp1}$ (D) denotes an increased value of the voltage as a function of the duty-cycle pursuant to the first implementation example IMP1 of the first embodiment, and $U_{dimp2}$ (D) denotes an increased value of the voltage as a function of the duty-cycle pursuant to the second implementation example IMP2 of the first embodiment.

For calculating $U_{dmax}$ (D) in table 1, a dissipation power associated in a case of a voltage or current drop of 2 Volt (in the following denoted as $U_{margin}$) at the current regulator 20 upon a duty-cycle of 100% is set as an acceptable starting point. The upper limits $U_{dmax}$ (D) stated for respective lower duty-cycles provide for values of a voltage increase, in which the dissipation power is held at the same level. Accordingly, the structure of the LED module 10 does not need to be altered when considering the upper limit.

Thereby, a voltage $U_d$ (D) output by the ECG 30 to das LED module 10 is given by:

$$U_d(D) = U_{margin} + U_{str}$$

Using the voltage or current drop $U_{margin}$ (D=100%) at the current regulator in case of a duty-cycle of 100%, a theoretical upper limit $U_{dmax}$ (D) may be expressed as:

$$U_{dmax}(D) = U_{margin}(D=100\%) \cdot 1/D + U_{str}$$

An increase of $U_{dmax}$ (D) as a function of the duty-cycle D should then obey:

$$U_{dmax}(D) < U_{margin}(D=100\%) \cdot 1/D + U_{str}$$

Setting $U_{str}$=22 V and $U_{margin}$ (D=100%)=2 V, it then follows:

$$U_{dmax}(D=100\%) = 24 \text{ V, as well as}$$

$$U_{dmax}(D<100\%) = 2 \text{ V} \cdot 1/D + 22 \text{ V}$$

Figure 5:
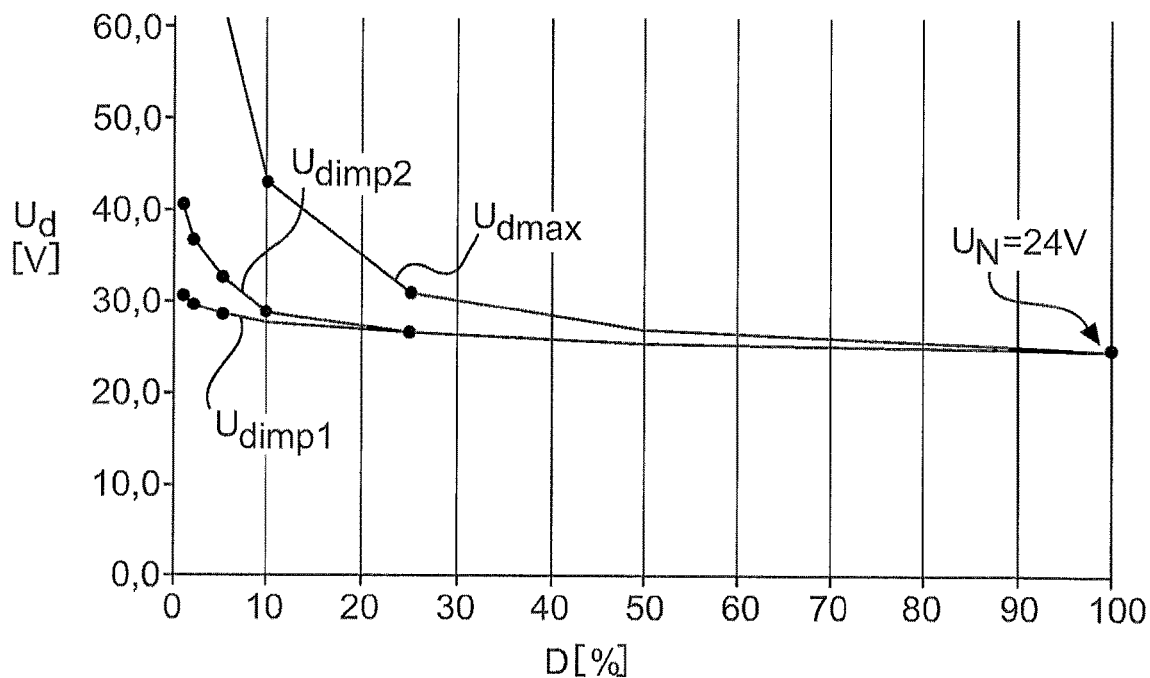
FIG. 5 shows in a diagram a proposed upper limit as well as example functions for a pulse width dependent voltage increase in rectangular pulses generated according to the first embodiment.

The values stated in table 1 are included in the diagram of FIG. 5. A case without dimming (D=100%) herein corresponds to conventional operation without applying an output voltage increase (i.e. at the nominal voltage $U_N$) and serves as a reference for the increase.

A modification of the embodiment is described in the following: instead of presetting a function between the pulse width and the voltage increase in the ECG 30 by virtue of dedicated circuit arrangements, it is also contemplated to apply the voltage increase in an adaptive manner during operation by including intermediate test cycles. In this regard, two variants are proposed:

Firstly, as indicated above and in FIG. 4, a current measuring device 31 may be suitably arranged in the ECG 30, which measures an output current supplied to the LED module 10. The output current is measured with respect to the currently operated pulse width in at least two different points in time within the same pulse in a test cycle.

The measurement is preferably made a first time within a time range close to the rising edge of the pulse, i.e. at the start of the voltage or current pulse, and a second time for example in the middle of a pulse, or towards its end. The two measured values are compared with each other. A large difference between the two measured values is an indicator of a distorted or dispersed pulse which in turn may lead to a considerable voltage or current drop in the last SEUs or module units 14 of an LED module 10 and thus to a black-out, light attenuation of single LED strings or LEDs therein.

According to the present modification, the voltage $U_d$ supplied at the output terminal 34 is increased with respect to the nominal voltage $U_N$ during operation of the LED module 10 using the present pulse width depending from a result of the comparison, or is adjusted to another value. The current measurement device 31 may comprise its own control device which actively adjusts the output voltage at the buck converter 38. This process can be repeated periodically during operation in order to adaptively regulate the output voltage. It may be noted that the current measuring device 31 measures the current flowing to/through all SEUs/module units 14 and derives a signature of pulse distortion in case of short pulses from the comparison, and then allows adjustment of the output voltage by the converter.

Secondly, an alternative current measuring device 31 may be suitably arranged in the ECG 30 (see also FIG. 4), which measures an output current supplied to the LED module 10, wherein hereby an output current is measured and compared with respect to differing pulses, i.e. at differing pulse widths or duty-cycles. If this is performed during operation and dimming, corresponding test cycles have to be included in between. As a basis the output current is measured for operation using a first pulse width and for operation using at least a second pulse width different form the first pulse width, each time of course within a duration of a respective pulse. The two measured values of the current are compared with each other. Also this alternative current measuring device 31 may include its own control device.

If for example a dim value associated with a duty-cycle of just 1% is presently set (at a frequency (PWM) of 2 kHz), then a first output current value can be measured for that specific duty-cycle using the current measuring device 31. The "ON"-time for this example amounts to 5 μs, the "OFF"-time 495 μs. In order to determine whether the present current reveals a signature of darkening or black-out, a second test cycle is activated. In this case for example, a current measurement is performed by the current measuring device 31 using a pulse width corresponding to a duty-cycle of 10%. Now, the pulse having a pulse width of the second measurement which is 10 times longer than that of the first measurement is set into a period which is also 10 times longer as that of the first measurement. In other words, the period as well as the pulse width of the pulse are congruently expanded while the duty-cycle (1%) and thus the dim value) is held fixed. The "ON"-time for this second test cycle amounts to 50 μs, however the "OFF"-time lasts 4950 μs.

In case the measured values are considerably different, the voltage supplied by the ECG 30 at the output terminal 34 may be increased with respect to the nominal voltage like in the first modification—in case of operation using the first pulse width (5 μs) as well as in case of using the second pulse width (50 μs)—dependent from the result of the comparison, or may be adjusted. It is to be understood that the stated values are purely illustrative and other factors such as 100 instead of 10 may also be used to provide an additional reference pulse width to the short pulse width. Moreover multiple test cycles using more than two pulse widths may be performed.

According to a further modification, the test cycles are only repeated after lapse of larger time spans, e.g., only every 60 s, since the user might recognize a single expansion of the PWM period with less probability, then.

Figure 7:
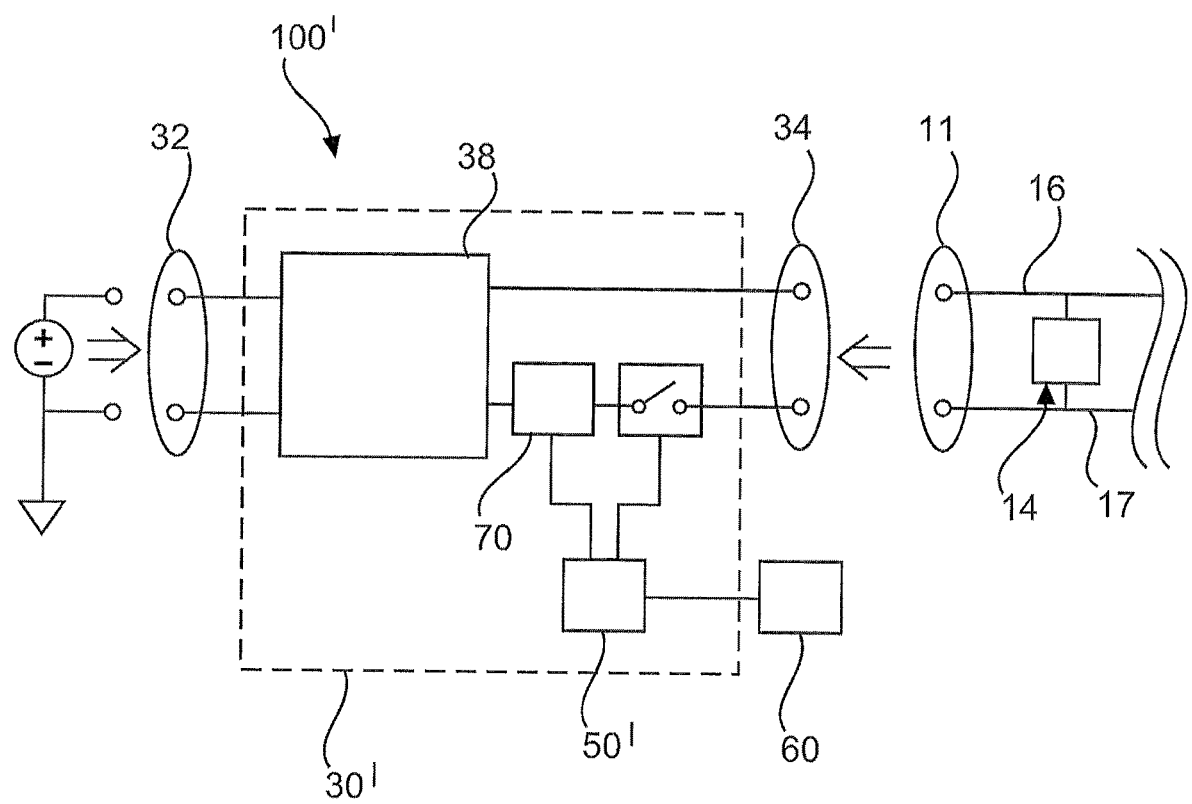
FIG. 7 shows a schematic block diagram of a circuit assembly according to a second embodiment.

A second embodiment of a circuit assembly 100' is shown in FIG. 7. Only the differences with respect to the first embodiment are described. In this embodiment, the electronic switch 40 is arranged on a cathode side or minus pole side of the circuit assembly. As in the first embodiment, the electronic switch 40 is controlled by a control device 50' that provides for the PWM signal arranged in accordance with a dimming value obtained from a dimming device 60. In addition to the electronic switch 40, there is further provided a pulse shaping unit 70, which as a consequence of the pulse width modulation effected by switching the electronic switch 40, reshapes each pulse during an "ON"-time of the switch. In order to initiate re-shaping of the respective pulses, the pulse shaping unit 70 is also connected with the control device 50'.

Unlike the first embodiment, according to the second embodiment a fixed voltage shape is provided for each pulse independent from the pulse width, such that pulses having different pulse widths only differ by the duration until cutoff at the falling edge of the pulse. However, more importantly, the second embodiment provides for a variation of the voltage supplied by the ECG to the output terminal during a pulse within an increase only during a first time slice adjacent and close to the rising edge of each pulse.

Figure 8:
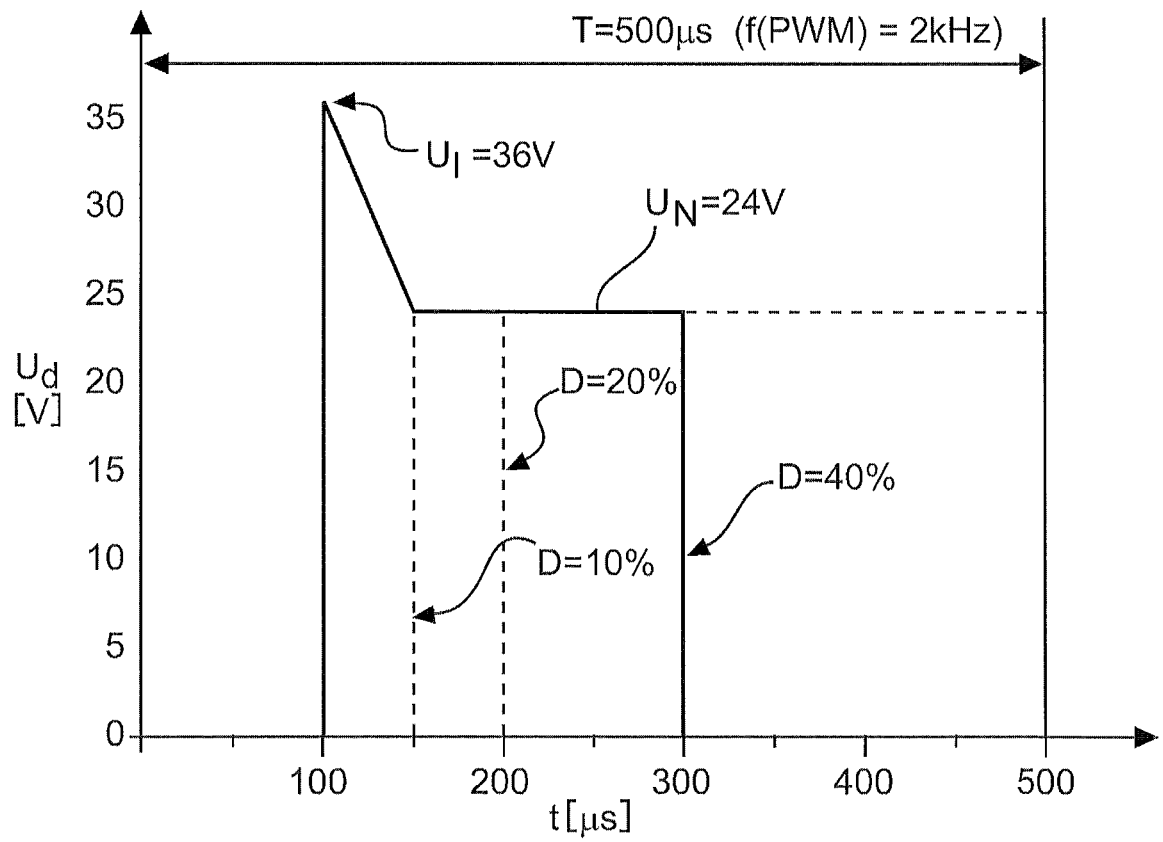
FIG. 8 shows in a diagram a voltage sequence versus time for pulses of differing pulse widths (duty-cycles), which are each generated pursuant to the second embodiment.

An example of the voltage sequence pursuant to the second embodiment is shown in FIG. 8. In the diagram the voltage $U_a$ supplied by the ECG 30' at the output terminal 34 is shown versus time, wherein a solid line indicates the voltage sequence of one pulse having a pulse width of 200 μs within a period having a length of 500 μs (corresponding to a PWM frequency of 2 kHz). The duty-cycle consequently amounts to 40%. The voltage sequence of the pulse reveals a two-part shape having a first time slice, which lasts—herein only illustratively—for about 50 μs and includes an initially peak-like increased value of the voltage (36 Volt), which then declines more or less linearly to the nominal voltage $U_N$, herein 24 V. The sequence continues in a second time slice, within which the value of the voltage substantially conforms constantly to the nominal voltage $U_N$, i.e., also 24 V. This second time slice lasts for the specific pulse shown for 150 μs at a duty-cycle of 40%. In FIG. 8 there are further shown as dashed lines voltage sequences for pulses having duty-cycles of 10%, 20% or larger than 40%.

A common characteristic of the voltage shape is the voltage increase peak at the beginning (within the first time slice) of each pulse, followed by a decline towards the nominal voltage $U_N$. Depending on the pulse width there consequently arises—like in the first embodiment—an effect that a mean value of the voltage supplied at the output terminal 34 during an ON-time of the pulse becomes larger for shorter pulse widths as compared with larger pulse widths. However, different from the first embodiment, the voltage increase is advantageously limited to a small time slice starting at the rising edge of the pulse. This particular advantage arises because within this time slice the problematic voltage or current drop within the last SEUs/module units 14a of the LED module 10 remote from the connection terminal 11 becomes most prominent.

The voltage sequence shown in FIG. 8 and applicable to pulses of various pulse widths may be achieved by active or passive circuit parts used as pulse shaping units 70.

A particular advantage arises according to this embodiment because the efficiency of the system is improved since in the case of the SEU/module unit 12 being closest to the connection terminal 11 an overcharge of its current regulator can be avoided due to the short duration of the voltage increase. In contrast, the more distant the SEUs/module units 14 are from the connection terminal 11 or output terminal 13, the stronger is the compensating effect with regard to the voltage or current drop.

It is noted that other shapes of the voltage sequence profile than that shown in FIG. 8 are possible and encompassed by embodiments. Also, it is possible that the voltage sequences differ from each other when applied to pulses driven with differing duty-cycles (e.g., as in a combination of the first and second embodiments). It is further noted that pulse-shaping units 70 may be realized according to the requirements. Detail embodiments will be explained below. For the purpose of this second embodiment the unique voltage sequence with respect to the pulse duration is important with a voltage increase occurring in a first time slice starting with a rising edge of the respective pulse, such that a dissipation power is reduced, the ECG 30 does not need to be adapted in structure, and the effects of light attenuation are avoided at the distal end of the LED module 10.

Figure 9:
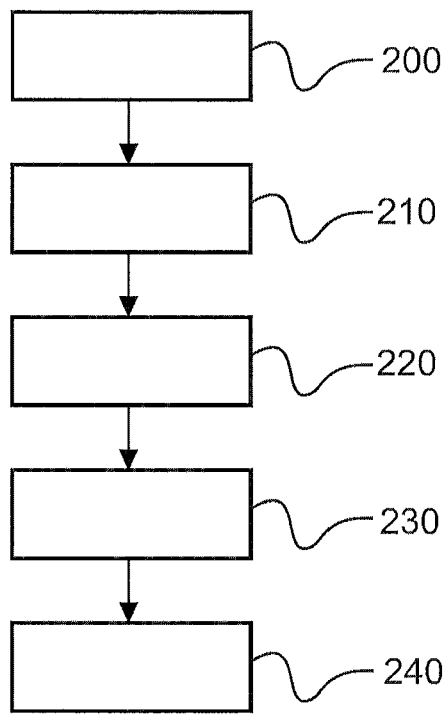
FIG. 9 shows a flow chart of a method (first and second embodiments covered)

In FIG. 9 is depicted an exemplary flow chart showing steps according to embodiments of a method. In step 200 a circuit assembly 100, 100' including an ECG 30, 30' having an electronic switch 40 and a control device 50, 50' for performing PWM at a predetermined frequency using the electronic switch 40 and an output terminal 34 is provided. An LED module 10 adapted to be operated at a nominal voltage $U_N$ is connected and power is supplied to an input terminal 32 of the circuit assembly. Further, an external dimming device 60 is connected to an interface of the control device 50, 50'.

In step 210, the control device 50, 50' obtains a dim value from the dimming device 60.

In step 220, the control device 50, 50' determines a duty-cycle and/or a pulse width to be used for operating PWM from the dim value.

In step 230, e.g., either the current measuring device 31 as shown in FIG. 4 or the pulse shaping unit 70 as shown in FIG. 7 effect an increase of the voltage $U_d/U_a$ supplied at the output terminal 34 to the LED module 10 with respect to the nominal voltage $U_N$ for at least a first time slice starting with a rising edge of a pulse.

In step 240 the voltage sequence generated in step 230 is repeated for the subsequent pulses of the pulse width modulation.

In case of a newly set dim value, steps 210 through 240 are repeated with regard to the new dim value.

It is noted that the embodiments illustrate specific examples and are not intended to limit the scope defined in the appended claims. In particular, individual features described with respect to single embodiments may also be implemented in other embodiments to achieve corresponding results therein. For example, the voltage sequence shown with respect to the second embodiment in FIG. 8 may be applied to the individual pulses depicted in FIG. 6 with respect to the first embodiment. Conversely, the pulse shaping unit 70 illustrated in FIG. 7 may be implemented in the circuit assembly shown in FIG. 4. Further modifications are possible. Also, the circuit assembly is not limited to the above described flexible LED strips, but may rather be applied also to other dimmable lighting systems which comprise sequentially arranged self-contained module units (SEUs).

Further embodiments relate to particularly advantageous arrangements of circuit assemblies provided to perform methods of operating an LED module as described above, wherein specifically the voltage sequence shown in FIG. 8 is implemented. Some of the embodiments will be explained as follows:

A third, more specific embodiment of a circuit assembly 100' is explained with reference to FIG. 10. Therein, the same reference numerals as used in the above described embodiments denote the same or similar parts and repeated description thereof will be avoided.

Figure 10:
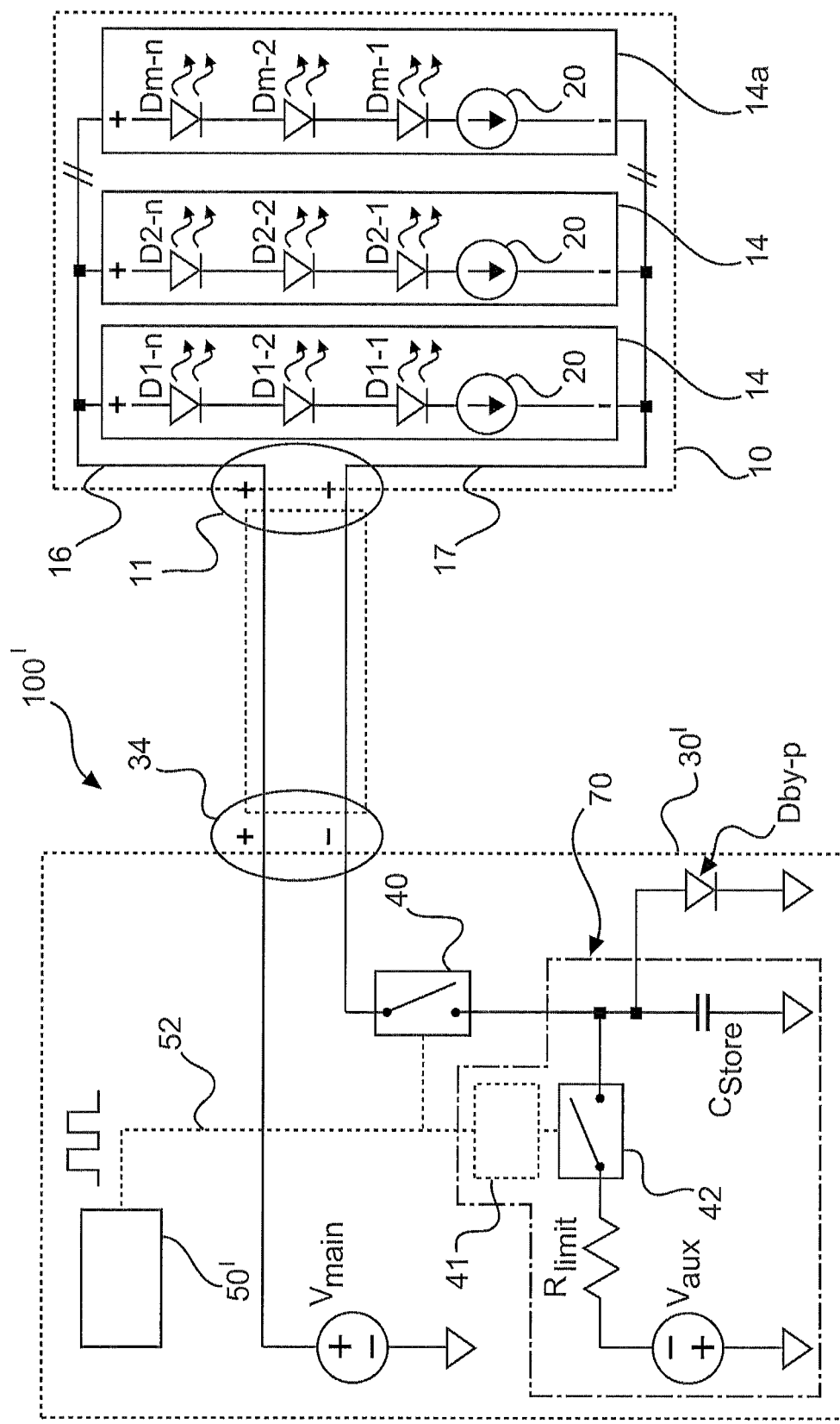
FIG. 10 shows in a block diagram an LED module connected to a circuit assembly according to a third embodiment.

The electronic control gear 30 (ECG) schematically shown in FIG. 10 includes the control device 50' as defined above which obtains a dim value from the external dimming device (not shown herein) and generates a pulse width modulation (PWM) signal. The control device 50' is connected with the electronic switch 40 and with an inverter 41 via PWM signal line 52 over which the PWM signal is transmitted to both parts. The electronic switch is operated by the PWM signal also as describe above such as to be opened and closed in accordance with the signal.

The buck converter 38 of the above embodiments is in FIG. 10 generalized to be a DC power supply $V_{main}$ which supplies a constant voltage of herein 24 V, and which more specifically provides an anode side operation voltage potential of +24 V to connection line 16. The power supply $V_{main}$ is connected with connection 16 via first output terminal portion 34a of the ECG output terminal 34 and first connection terminal portion 11a of the connection terminal 11 of the LED module 10. The LED module 10 is the same as shown in FIG. 2A and repeated description shall be omitted herein.

As noted it is one key point of this and the following embodiments that the "nominal" output voltage $U_N$ of the power supply $V_{main}$ is preserved, i.e., the voltage at which the power supply is delivering its nominal power is not changed but held constant. This advantageously enables to avoid any overdesign of, e.g., the converter and the ability to keep an existing product framework.

The connection line 17 forms the return path in the LED module 10 on the cathode side, wherein it is connected to the ground or reference voltage potential (defined as 0 V) via second connection terminal portion 11b of connection terminal 11, second output terminal portion 34b of ECG output portion 34, electronic switch 40 and diode Dby-p. The diode Dby-p has its cathode terminal connected to the reference potential and its anode terminal connected with the electronic switch 40, and thus will be operated in forward direction during conventional use (i.e., without pulse shaping unit 70 being activated).

As a second key point, it is noted that the electronic switch 40 is provided within the current return path on the cathode side of the circuit assembly 100'. An advantage herein arises in that the dimming circuitry (i.e., the electronic switch 40) is herein based on an N-type switch, for example an N-MOSFET, which is cheaper than a P-type switch and which has a common ground signal driving that eases all the circuitry around.

As a consequence of the key points above, an anode side voltage potential is to be held fixed while a need arises to extend the voltage range for at least an initial time slice of each pulse. Therefore, the embodiment provides for a pulse shaping unit 70 which acts to connect the current return path with base potential below 0 V, for example herein −12 V to yield an increased voltage difference of, e.g., 36 V. This is achieved by providing a charge pump including an auxiliary voltage supply, a charge switch and a capacitor charged at −12 V with respect to the ground or reference voltage potential.

As shown in FIG. 10, the pulse shaping unit 70 therefore comprises the charge pump including an auxiliary voltage supply $V_{aux}$ supplying a base voltage of −12 V with respect to the ground or reference voltage potential and a charge switch 42 which is connected with its one terminal to the auxiliary voltage supply $V_{aux}$ via a resistor $R_{limit}$, that is suitably dimensioned to set a desired charge time of the capacitor $C_{store}$. The other terminal of the charge switch 41 is connected with the cathode side (or ground potential side) terminal of the electronic PWM switch 40 and with one terminal of the capacitor $C_{store}$, whose other terminal is in turn connected with the ground or reference potential. It is the capacitor $C_{store}$ that is able to store the needed energy to develop the boost voltage or overvoltage within the first time slice of a pulse.

This charge pump is active during the PWM "OFF"-time, i.e., while the electronic switch 40 is open. To allow charging the capacitor $C_{store}$ in a coordinated manner with the pulse width modulation, i.e., in accordance with "ON"- and "OFF"-times, the charge switch 42 is controlled by the PWM-signal submitted via signal line 52 (indicated in FIG. 10 by a dotted line) similar to electronic switch 40, wherein a further inverter 41 is interconnected between the charge switch 42 on the one side and the control device and the PWM switch 40 on the other side, such that when the electronic (PWM) switch 40 is "ON", the charge switch is "OFF" and vice versa. Similar to the electronic switch 40, the charge switch 42 may be an N-type switch, in particular an N-MOSFET.

In operation of the circuit assembly 100', while the electronic switch 40 (main switch) is open (PWM: "OFF"), the charge switch 42 (auxiliary switch) is closed and the $C_{store}$ is charged via resistor $R_{limit}$ in a characteristic time $\tau = R_{limit} \cdot C_{store}$ until a voltage potential of −12 V with respect to ground is reached on the side of the capacitor terminal connected with the electronic switch 40. At the beginning of the PWM "ON"-time, or rising edge of a respective pulse, the electronic switch 40 is closed, and the cathode side output terminal portion 34b is forced to the potential of the connected capacitor terminal, which is negative, i.e., −12 V. Therefore, the total voltage supplied to the LED module 10 is the sum of the static output of the ECG 30, i.e., 24 V, and of the capacitor potential 12 V, which is 36 V. During charging, the by-pass diode $D_{by\text{-}p}$ is in reverse bias.

The capacitor discharges completely and then starts charging with reverse polarity due to the LED current, until the by-pass diode $D_{by\text{-}p}$ goes into forward bias, carrying all the current. During the "ON"-time, the capacitor-charge switch 42 may be set in "off"-position in order to save energy. At the beginning of the next main switch "OFF"-time, the charge switch 42 is closed again and the capacitor starts charging for the next cycle.

It is noted that the diode $D_{by\text{-}p}$ by-passes the capacitor $C_{store}$ once it is discharged, by connecting the main switch terminal to the power ground, so preventing the capacitor to be charged on the opposite polarity.

In this embodiment, during the overvoltage time, i.e. during the first time slice, the current delivered to the SEUs (module units 14) is initially zero, while the increased voltage is used to build the current path that is needed to emit light. Actually, once a current path is established, the aim of the increased voltage is reached and it is not further needed for the remainder of the pulse. Nevertheless, as described in detail above a dispersive propagation delay of the pulse signal arises along the connection lines 16, 17 and in the SEUs, which causes the last SEU or module unit 14a to be supplied with this pulse signal significantly later than for example the first module unit.

Accordingly, the duration of the increased voltage (overvoltage) is intended to last at least for the duration of the propagation delay, which amounts to just a few microseconds. Hence, the energy needed during this phase may be low, and may be greatly independent from the SEU type and current, since it is almost spent in charging the parasitic elements of the connection lines 16, 17 and the PCB of the module units 14. The latter are similar even for very different LED module power levels. This energy can be easily stored into the capacitor $C_{store}$, in order to construct the "charge pump" of this embodiment which pulls down the return path (connection line 17) to, e.g., said −12 V, so giving the expected 36 V total potential at the output terminal portions 34a, 34b. The charge is injected into the connection lines, and with laps of time during the pulse, the envelope of the pulse signal naturally declines the nominal voltage of 24 V, which in turn yields the shape of the voltage sequence shown in FIG. 8 with respect to the second embodiment.

Figure 11:
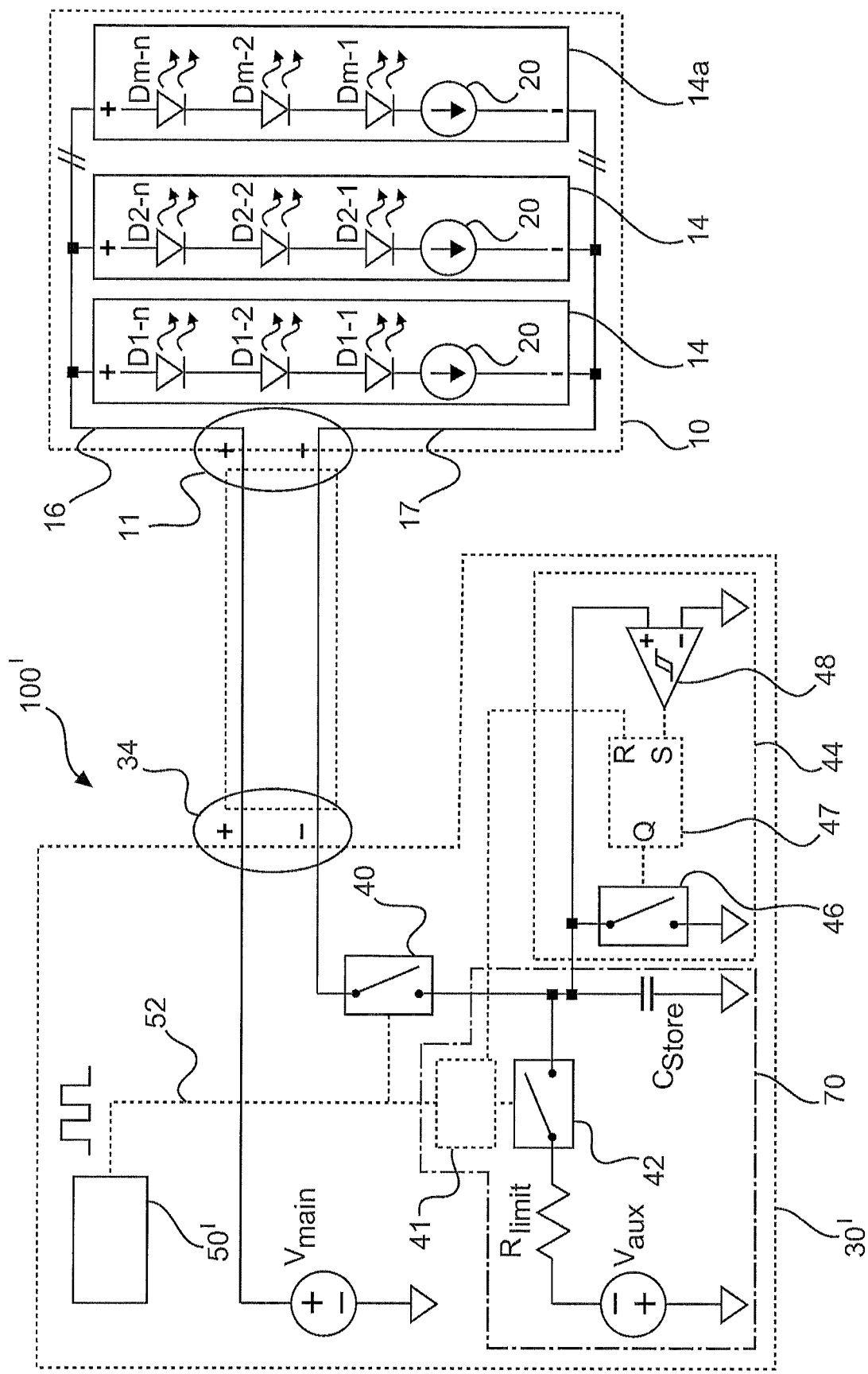
FIG. 11 shows in a block diagram an LED module connected to a circuit assembly according to a fourth embodiment.

A fourth embodiment of a circuit assembly 100' is shown in FIG. 11. The fourth embodiment basically represents a modification of the third embodiment and only differences with respect to the third embodiment are explained. In particular, the charge pump itself comprising auxiliary voltage supply $V_{aux}$, the resistor $R_{limit}$, the charge switch 42 and the capacitor $C_{store}$ are the same or similar as in the third embodiment.

In FIG. 11, however, the diode $D_{by\text{-}p}$ shown in FIG. 10 has been replaced with an auxiliary controlled switch 46, in order to mitigate the power loss due to the original diode $D_{by\text{-}p}$ when the full static current is passing across it (the diode keeps about 0.7 V of forward voltage). The controlled switch 46 does not afford a forward voltage and thus improves greatly the overall efficiency of the system.

The auxiliary controlled switch 46 by-passes the capacitor $C_{store}$ once it is discharged, by connecting the cathode side terminal of the electronic switch to the ground or reference voltage potential. The auxiliary controlled switch 46 thus prevents the capacitor $C_{store}$ from being charged towards the opposite polarity like diode $D_{by\text{-}p}$ does in the third embodiment.

In order to accomplish the function, an auxiliary switch controller 47 connected to the control switch 46, is provided being configured to drive the auxiliary control switch 46 into closed state once the storage capacitor has been fully discharged. The auxiliary switch controller 47 is also configured to open the control switch 46 during the PWM "OFF"-time, in order to allow its recharging. The auxiliary switch controller 47 may be provided in the form of a flip-flop as shown in FIG. 11. Then, in order to control the sets or resets of the switch, a voltage comparator 48 may be provided which is connected to both capacitor terminals on its input side, and which by virtue of the comparison of this potential with a programmed threshold, closes the bypassing auxiliary control switch 46 by setting auxiliary switch controller 47 by means of a respective connection on its output side. A reset may performed by a connection between the inverter 41, which as stated above also controls the charge switch 42 in coordinated manner with the electronic switch 40 using the PWM signal on signal line 52 generated by control device 50', and the auxiliary switch controller 47. Accordingly, with each falling edge of a PWM pulse, a reset is initiated in auxiliary switch controller 47 that in turn opens auxiliary control switch 46.

It is noted that alternative to the voltage comparator 48, also a current comparator may be provided, which reads the current across the body diode of the auxiliary control switch 46, in order to close it when its magnitude exceeds a certain threshold.

The operation is similar to that described with regard to the third embodiment. However, once the capacitor $C_{store}$ is discharged during "ON"-time till its voltage approaches the ground potential, the comparator 48 sets a latch in auxiliary switch controller 47 to close the bypassing control switch 46. Thus, the LED current starts to flow across this control switch 46 and the capacitor is kept discharged. During the "ON"-time, the capacitor charge switch 42 can be set in off position in order to save energy. The falling edge of the PWM pulse, however, then resets the auxiliary switch controller 47, in order to allow the capacitor $C_{store}$ to be charged again by the auxiliary voltage supply $V_{aux}$ via the charge switch 42, which is closed simultaneously.

In this fourth embodiment, devices 46, 47, and 48 are considered to jointly form an "active diode" device since functions of a forward bias and reverse bias are mimicked by these components. It is noted that the auxiliary control switch 46 may also be of the N-type, in particular an N-MOSFET.

Figure 12:
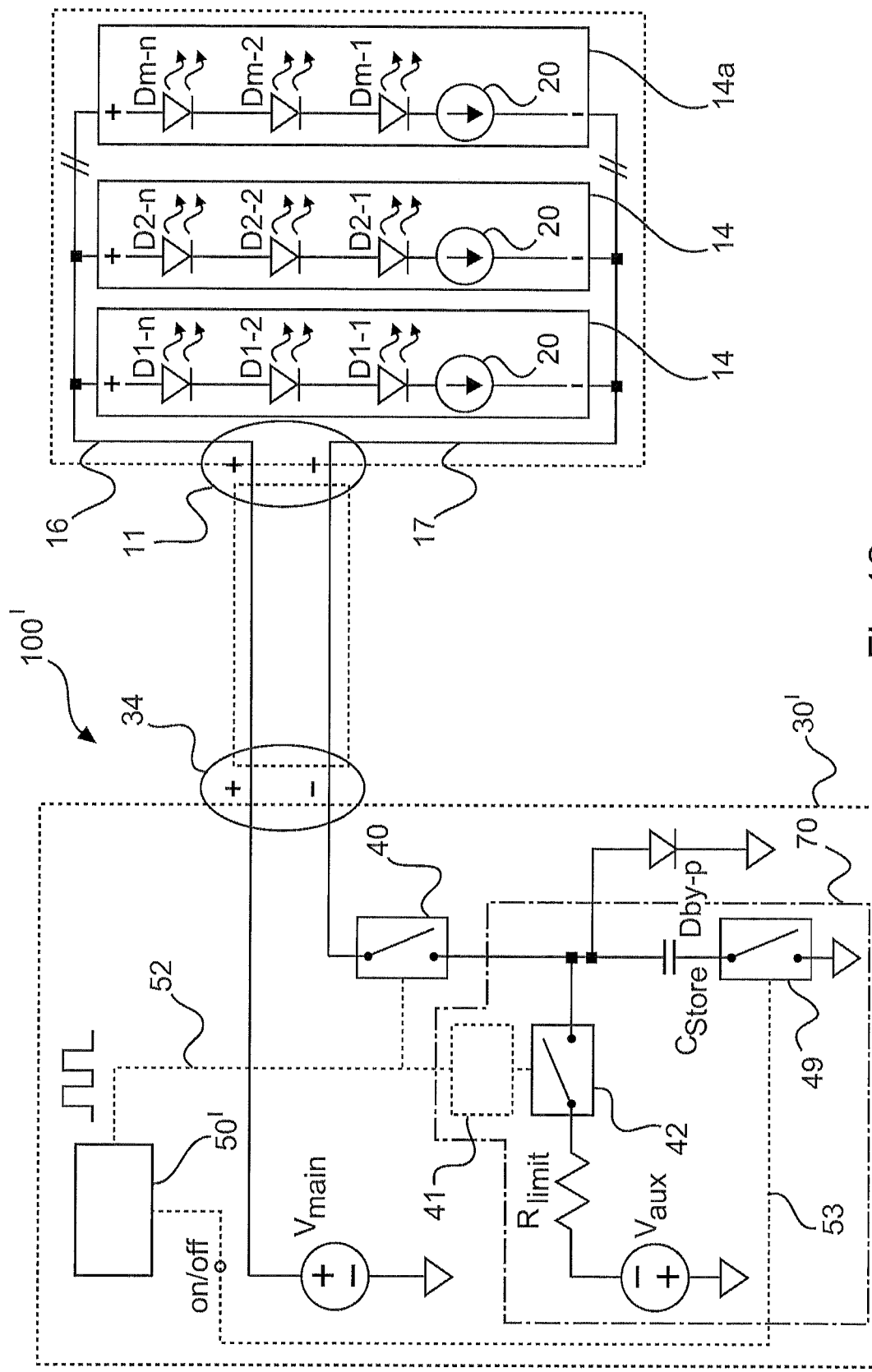
FIG. 12 shows in a block diagram an LED module connected to a circuit assembly according to a fifth embodiment.

In a fifth embodiment depicted in FIG. 12 another modification applied to the third embodiment is explained. Again, only differences with respect to the third embodiment will be explained.

In FIG. 12, an additional switch 49 is provided which allows switching-off the increased voltage generation. The additional switch may be interconnected between the terminal of the capacitor $C_{store}$ that is to be connected with the ground or reference potential and that ground or reference potential. The additional switch 49 is controlled via a connection with the control device 50' that also generates the PWM signal for controlling the main switch (electronic switch 40). The control device may control the additional switch 49 according to an operating condition of the pulse width modulation. For instance, a suitable threshold level (or light level) may be defined and/or programmed and stored, which corresponds to a duty-cycle of the PWM signal, beyond which the effects of voltage increase achieved may only contribute marginally to the quality of emitted light (no light attenuation, no black-out of LEDs). An on/off signal may be issued on corresponding signal line 53 to switch on or off the additional switch depending on whether the threshold value is exceeded or not by the currently applied duty-cycle, thereby selectively enabling or disabling the charge pump, respectively. Power may advantageously be saved using this feature. It is noted that a corresponding additional switch 49 may also be implemented in the fourth embodiment.

It may further be noted that in the above second to fifth embodiments, the method of generating the pulse envelope by the injection of an electric charge previously stored in a capacitor $C_{store}$ during the PWM "OFF"-time at a given duty-cycle tends to extinguish automatically by its nature, when the PWM "OFF"-time become short or vanishes since the capacitor $C_{store}$ is not given sufficient time to be charged.

This effect can even be favorably used to program different voltage boost levels at different duty-cycles, i.e. to vary the shape of the pulse accordingly to dimming level. This finally leads to a system efficiency improvement and to avoiding excess stress on the current regulators in each SEU or module unit 14, which may be present to some extent in the first embodiment described above.

Next a sixth embodiment compatible with the fourth embodiment is described with reference to FIG. 13. A detail circuit diagram of the fourth embodiment is shown, wherein schematic blocks of FIG. 11 have been translated into electronic components and connections. For some of blocks, their functions have been integrated into other components order to save a number of components. For instance, a gate driver of the main switch MOSFET (electronic switch 40) is simultaneously used to charge the capacitor $C_{store}$, which is denoted in FIG. 13 as capacitor C2. Another example is the latch that controls the active diode MOSFET, which has been integrated into the comparator circuit by a simple resistive hysteretic network.

Figure 13:
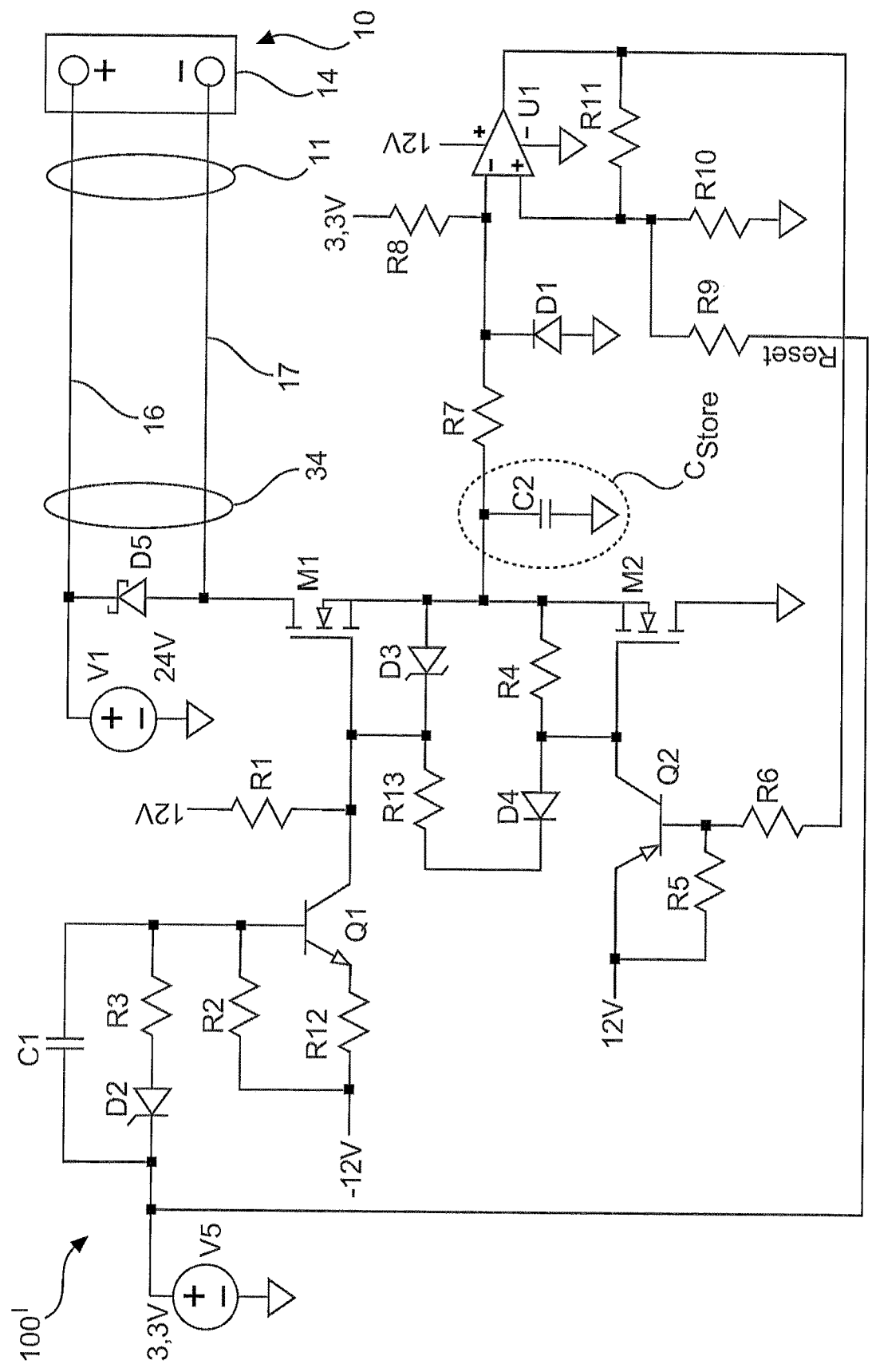
FIG. 13 shows in a circuit diagram an LED module connected to a circuit assembly according to a sixth embodiment.

In FIG. 13, numeral V5 denotes an external PWM signal generator (control device 50'), for instance a μController or similar low-voltage, low power devices. The voltage is intended to be a ground referenced 3.3 V. A capacitor C1, a diode D2 and resistor R3 form a base drive network, wherein diode D2 allows base drive shifting, because an emitter of NPN bipolar transistor Q1 is connected to a −12 V potential (corresponding to auxiliary voltage supply $V_{aux}$ in FIG. 11). The base drive network exerts a derivative effect (via capacitor C1) to improve the system speed. As indicated above NPN bipolar transistor Q1 simultaneously serves as a gate pull-down for a first N-MOSFET M1, which forms the main PWM switch or electronic switch 40, and—through diode D3—as a charger for the capacitor C2, which forms the charge reservoir capacitor $C_{store}$ in FIG. 11 for injecting the overvoltage. The diode D3 thereby limits the gate voltage of the first N-MOSFET M1 and allows charging of capacitor C2. NPN bipolar transistor Q1 is herein arranged as a current generator. In contrast, resistor R1 serves to pull-up the main N-MOSFET M1, i.e., is responsible to turn it on.

A second N-MOSFET M2 forms the auxiliary control switch 46 of "active diode" device 44. The second N-MOSFET M2 is also provided with a gate driver, which is a PNP transistor Q2. The collector of PNP transistor Q2 is connected to the gate of the second N-MOSFET M2 such as to turn the latter actively "ON", while the "OFF"-state is forced by NPN-transistor Q1 across a network comprising a resistor R13 and diode D4. A resistor R4 keeps the state normally "OFF" when none of the driving bipolar junction transistors are acting.

The "active diode" device 44 further comprises a voltage comparator U1 (which corresponds to voltage comparator 48 in FIG. 11), which turns on the second N-MOSFET M2 via PNP transistor Q2. An inverting input terminal of voltage comparator U1 is connected with one terminal of the capacitor C2 which is also connected with the MOSFET M1 via resistor R7. An output terminal of voltage comparator U1 is connected to a base of PNP transistor Q2 via a resistor R6. The resistor R7 and a diode D1 limit the input current when the voltage between the terminals of capacitor C2 becomes negative, while a resistor R8 connecting the inverting input terminal of voltage comparator U1 with a voltage source of 3.3 V provides a small offset to overcome a non-ideality of voltage comparator U1.

Resistors R9, R10 and R11 make up a resistive logic for the latching block corresponding to auxiliary switch controller 47, with the reset directly obtained by the non-inverting input terminal of voltage comparator U1 from the PWM control signal via resistor R9. The same terminal is connected to ground via resistor R10, and to the output terminal of the voltage comparator U1 via resistor R11 providing a voltage feedback.

An anti-inversion diode D5 interconnected between the output terminal portions 34a, 34b avoids an LED damage due to inductive energy storage into the connection lines and into the stray inductance of the LED PCB, in FIG. 13 just schematically represented by one of the module units 14. A power supply V1 corresponds to the power supply $V_{main}$ mentioned above and denotes the fixed voltage main power supply (24 V). Its output is the common anode connection line 16 in multiple channel systems.

Figure 14:
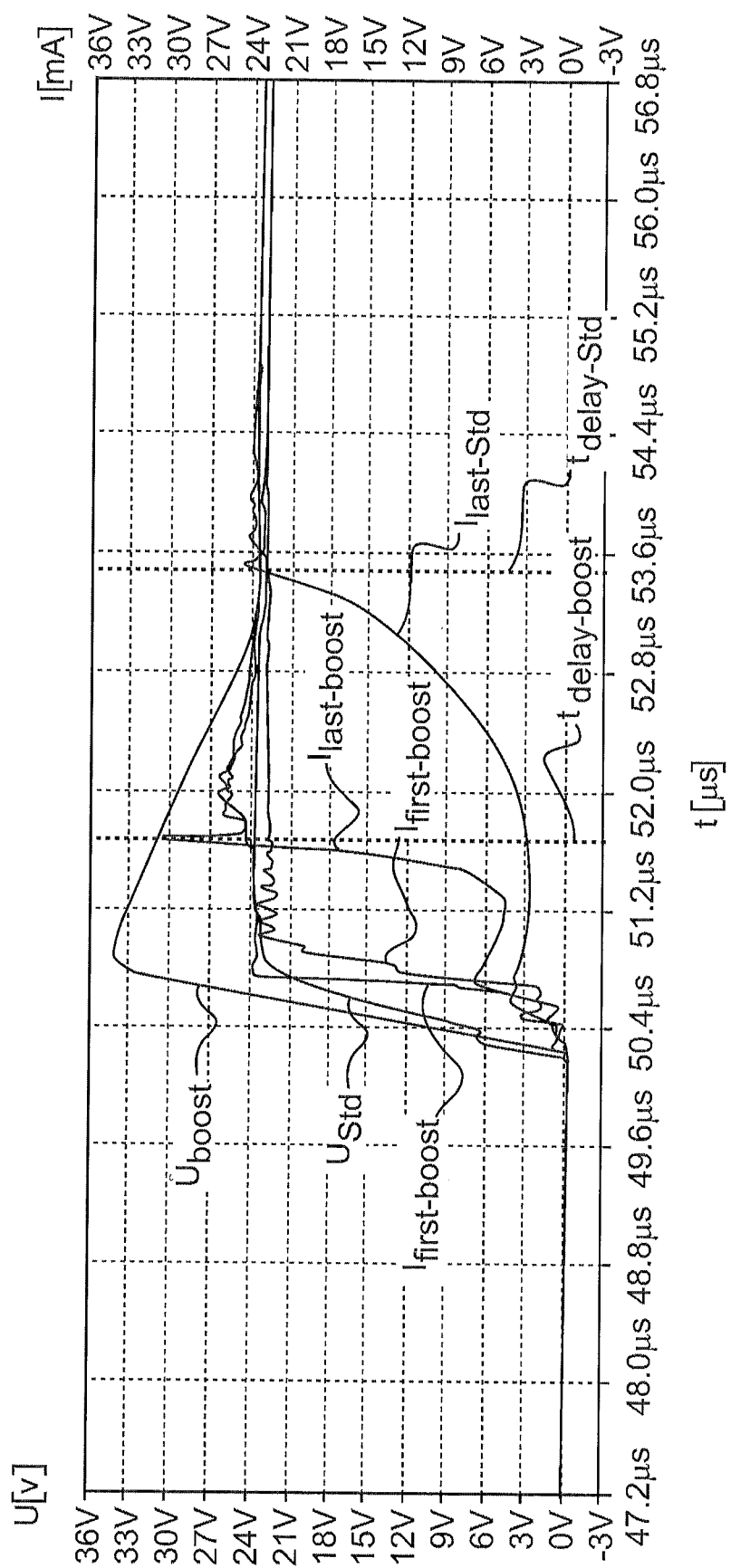
FIG. 14 shows—based on the circuit assembly shown in FIG. 13—a sequence or time variation of voltages supplied at the output terminal and of currents flowing the first and last module units or SEUs of an LED module in comparison between a case of applying the circuit assembly including a voltage increase or boost and the conventional or standard case without boost.

Results of a comparative simulation using a circuit assembly as shown in FIG. 13 is depicted in FIG. 14. The LED module 10 connected to the circuit assembly has 100 SEUs (module units 14) and the length of the module amounts to 10 m. The cable has a length of 10 m and a cross sectional area of 1.5 mm². In the diagram, plots of the voltage signal shape or waveforms are depicted for the case of a pulse width modulation applying the voltage increase ($U_{boost}$) supplied at the out terminal 34 of the circuit assembly and for a conventional pulse width modulation without an initial voltage increase within each pulse ($U_{std}$). Only a time range around the rising edge of the pulse is shown. As can be seen an overvoltage of 11 V (35 V in total) at maximum is applied using the charge pump and energy injection mechanism. The first time slice has a duration of about 3 μs, after lapse of which the nominal voltage of 24 V is reached again by the declining voltage $U_{boost}$.

Also shown in FIG. 14 is the resulting time variation of the current through a respective first SEU ($I_{first\_boost}$ and $I_{first\_std}$) and a respective last SEU ($I_{last\_boost}$ and $I_{last\_std}$) within the sequence. The point in time until the current reaches the full level needed to avoid light attenuation is denoted as $t_{delay\_boost}$ and $I_{delay\_std}$, respectively. As can be clearly derived from FIG. 14, a delay reduction of 1.85 μs is achieved, which represents a 37% increase of light for a 2 kHz, 1% duty-cycle PWM signal. In case of a 0.5% duty-cycle (same PWM frequency), the improvement becomes even equal to about 75%.

In the above embodiments, a nominal voltage supplied by the electronic control gear (ECG) or buck converter is described to range at 24 Volt. However, other nominal voltages such as 6 V, 12 V, 36 V, 48 V etc. are possible as well.

In the above third to sixth embodiments, a charge pump comprising a capacitor is provided which stores the energy to be injected into the LED module at the beginning of a pulse. Nevertheless, a suitable circuit arrangement may make use of an inductor storing energy in a magnetic field built up during "OFF"-times.

Further modifications may be applied to the embodiments without departing from the scope provided in the appended claims.

LIST OF REFERENCE NUMERALS $AC_{mains}$ power supply
C2, $C_{store}$ energy injection capacitor
Dby-p bypass diode
D1 diode
D2 diode
D3 diode
D4 diode
D5 anti-inversion diode
Dm-1 light emitting diode, LED
Dm-2 light emitting diode, LED
Dm-3 light emitting diode, LED
Dm-4 light emitting diode, LED
Dm-5 light emitting diode, LED
Dm-6 light emitting diode, LED
Dm-7 diode
Dm-8 light emitting diode, LED
Q10 PNP bipolartransistor
Q20 PNP bipolartransistor
Q30 PNP bipolartransistor
Q40 PNP bipolartransistor
R1 resistor
R2 resistor
R3 resistor
R4 resistor
R5 resistor
R6 resistor
R7 resistor
R8 resistor
R9 resistor
R10 resistor
R11 resistor
R12 resistor
R13 resistor
R15 resistor
R25 resistor
R35 resistor
R45 resistor
$U_a$ output voltage (at output terminal)
$U_d$ output voltage (ECG)
$U_N$ nominal voltage (LED module)
U1 voltage comparator
V5, $V_{aux}$ auxiliary voltage supply
V1, $V_{main}$ constant voltage main power supply
10 LED module
11 Connection terminal (LED module)
11a first input terminal
11b second input terminal
12 LED
13 Transition point (between module units of an LED strip)
14 module unit, shortest electrical unit (SEU)
16 connection line (operation potential)
16a node for LED string
17 connection line (reference potential)
17a node for LED string
18 diode
20 current regulator, linear regulator
21 input terminal of current regulator
22 Output terminal of current regulator
30 ECG ($1^{st}$ embodiment)
30' ECG ($2^{nd}$ embodiment)
31 Current measuring device
32 input terminal (circuit assembly)
32a first input terminal portion
32b second input terminal portion
34 output terminal
34a first output terminal portion
34b second output terminal portion
38 buck converter
40 electronic switch (PWM)
41 inverter
42 charge switch
44 active diode device
46 auxiliary control switch
47 auxiliary switch controller, latch
48 voltage comparator
49 additional switch
50 control device (PWM) ($1^{st}$ embodiment)
50' control device (PWM) ($2^{nd}$ embodiment)
51 Interface
52 PWM signal line
53 on/off signal line (activate/deactivate voltage increase)
60 dimming device
90 power supply
100 circuit assembly ($1^{st}$ embodiment)
100' Circuit assembly ($2^{nd}$ embodiment)
200 step: provide circuit assembly, connect power supply, dimming device and LED module
210 step: obtain dim value from dimming device
220 step: determine duty-cycle from dim value
230 step: increase output voltage at output terminal for at least first time slice within pulse with respect to nominal voltage
240 step: repeat for further pulses

The invention claimed is:

1. A circuit assembly for operating an LED module comprising a plurality of module units interconnected between common connection lines in a sequential order with increasing distances towards a connection terminal of the LED module, the circuit assembly comprising:
an input terminal for connecting with a power supply and an output terminal for coupling with the connection terminal of the LED module directly or via a cable;
an electronic control gear including an electronic switch and a control device, which comprises an interface for connecting with a dimming device to obtain a dimming value thereof, the electronic control gear being connected with the input terminal and configured to supply a pulse width modulated voltage at the output terminal, wherein the electronic switch controls the supplied voltage via opening and closing actions, and wherein the control device operates the electronic switch via pulse width modulation with a duty-cycle dependent from the dimming value at a predetermined period, such that the LED module connected to the output terminal is supplied with pulses of the voltage, which have a pulse width depending from the duty-cycle and the period;
wherein the circuit assembly is configured to increase an instantaneous value of the voltage supplied at the output terminal for a duration of a time slice of a predetermined width starting with a rising edge of a respective pulse with respect to a nominal voltage with which the LED module is to be operated in a case without dimming;

such that a voltage or current drop is counteracted in case of short pulse widths between the connection lines at a position of those module units in the sequential order which have the largest distance towards the output terminal when the LED module is coupled to the circuit assembly.

2. The circuit assembly according to claim 1, wherein the mean value taken of the voltage output during an ON-time of a pulse having a short pulse width is larger than a corresponding mean value of pulses having a comparatively larger pulse width.

3. The circuit assembly according to claim 1, wherein the short pulse width corresponds to a duty-cycle of 20% or less.

4. The circuit assembly according to claim 1, wherein the predetermined width of the first time slice corresponds to the pulse width and the value of the voltage supplied at the output terminal is adjusted depending from the respective pulse width.

5. The circuit assembly according to claim 4, wherein the increase of the voltage with respect to the nominal voltage supplied at the output terminal is incremented towards shorter pulse widths with increasingly growing values.

6. The circuit assembly according to claim 1, wherein the predetermined width of the first time slice is independent from the pulse width.

7. The circuit assembly according to claim 6, wherein the predetermined width of the first time slice corresponds to a duty-cycle of 10% or less.

8. The circuit assembly according to claim 6, wherein for at least a number or range of possible pulse widths, a fixed time sequence for the voltage increased with respect to the nominal voltage and supplied at the output terminal is provided for at least the first time slice, whose width in time is the same for each of these pulse widths.

9. The circuit assembly according to claim 8, wherein a second time slice joins the first time slice subsequently, where the supplied voltage substantially corresponds to the nominal voltage, wherein the substantially constant voltage sequence is cut-off in time at the end of the second time slice pursuant to the pulse width, and wherein the fixed time sequence for the voltage supplied at the output terminal and increased with respect to the nominal voltage includes a maximum value, starting from which the output voltage declines substantially linearly or exponentially towards the nominal voltage.

10. The circuit assembly according to claim 1, wherein each module unit comprises one or more LEDs connected in series together with a current regulator, which jointly form a self-contained smallest electrical unit, wherein the current regulator compensates for a remaining voltage difference between the connection lines within each module unit during operation which is not covered by a sum of forward voltages of the LEDs and optional further electrical components by dissipating power, wherein the voltage supplied at the output terminal is increased with respect to the nominal voltage dependent from the pulse width only to such an extent, that a dissipation power arising in the current regulator does not become larger than in case of a duty-cycle of 100%.

11. A circuit assembly for operating an LED module comprising a plurality of module units each interconnected between common connection lines in a sequential order with increasing distances towards a connection terminal of the LED module, the circuit assembly comprising:

an output terminal comprising a first output terminal portion and a second output terminal portion;

a main power supply for supplying an operation voltage potential to a first output terminal portion;

a control device for generating a pulse width modulation signal;

an electronic switch coupled to the control device and configured to obtain the pulse width modulation signal and arranged to connect and disconnect a second output terminal portion to/from a reference potential in accordance with the pulse width modulation signal, such that a pulse width modulated voltage is supplied to the output terminal;

wherein a pulse shaping unit coupled to the control device and configured to store electrical energy, when the electronic switch disconnects the second output terminal portion from the reference potential, and to release the stored electrical energy to the output terminal, when the electronic switch connects the second output terminal portion with the reference potential.

12. The circuit assembly according to claim 11, wherein the pulse shaping unit represents a charge pump comprising a capacitor.

13. The circuit assembly according to claim 12, wherein the pulse shaping unit further comprises:

an auxiliary voltage supply different from the main power supply, the auxiliary voltage supply supplying a predetermined voltage potential which is negative with respect to a ground potential, and a charge switch coupled to the control device and configured to obtain the pulse width modulation signal and arranged to connect and disconnect the auxiliary voltage supply with/from one terminal of the capacitor in accordance with the pulse width modulation signal, wherein the other terminal of the capacitor is connected with the ground potential.

14. The circuit assembly according to claim 13, wherein the one terminal of the capacitor is connected with a terminal of the electronic switch to allow releasing the electrical energy to the output terminal, when the electronic switch connects the second output terminal portion with the reference potential, wherein the reference potential is provided by an amount of electrical energy currently stored in the capacitor during release.

15. The circuit assembly according to claim 13, wherein a current limiting device is interconnected between the auxiliary voltage supply and the one terminal of the capacitor, when the charge switch connects auxiliary voltage supply with/from one terminal of the capacitor during operation.

16. The circuit assembly according to claim 13, wherein the pulse shaping unit further comprises an inverter interconnected between the control device and the charge switch, which inverts the pulse width signal obtained from control device and input to the charge switch to control switching, such that when the electronic switch connects the second output terminal portion to the reference potential, the charge switch disconnects the auxiliary voltage supply from one terminal of the capacitor, and vice versa, in accordance with the pulse width modulation signal.

17. The circuit assembly according to claim 13, further comprising:

a device configured to connect the terminal of the electronic switch with the ground potential when the electric energy stored in the capacitor has been released and a value of the reference potential has substantially approached the ground potential, while disconnecting the terminal of the electronic switch from the ground potential during release.

18. The circuit assembly according to claim 17, wherein the device is a diode, wherein an anode-side terminal of the diode is connected with the terminal of the electronic switch and a cathode-side terminal is connected with ground potential.

19. The circuit assembly according to claim 17, wherein the device is an active diode switching circuit, comprising:
an auxiliary controlled switch connected between the terminal of the electronic switch and the ground potential in parallel to the capacitor to allow bypassing of the capacitor when the auxiliary controlled switch is closed;
an auxiliary switch controller having an output terminal coupled to the auxiliary controlled switch to open and close the auxiliary controlled switch according to a set state of auxiliary switch controller;
a comparator arranged to compare a voltage between the terminals of the capacitor with a threshold value or to compare a current through a body diode of the auxiliary controlled switch with a threshold value, wherein an output terminal of the comparator is connected with an input terminal of auxiliary switch controller to set the state of the same;
wherein the auxiliary switch controller includes a further input terminal connected to an input control terminal of the charge switch in order to control the auxiliary controlled switch in accordance with the pulse width signal.

20. The circuit assembly according to claim 13, wherein the pulse shaping unit further includes an additional electronic switch connected between the capacitor and the ground potential and configured to enable storing and releasing electrical energy when the additional electronic switch is closed, and to disable storing and releasing electrical energy when the additional electronic switch is opened.

* * * * *